(12) United States Patent
Kim et al.

(10) Patent No.: US 11,947,764 B2
(45) Date of Patent: Apr. 2, 2024

(54) INPUT SENSING UNIT AND METHOD OF DRIVING THE SAME

(71) Applicant: SAMSUNG DISPLAY CO., LTD., Yongin-si (KR)

(72) Inventors: Ji Woong Kim, Yongin-si (KR); Oh Jo Kwon, Yongin-si (KR); Kyung Tea Park, Yongin-si (KR); Keum Dong Jung, Yongin-si (KR); Sang Hyun Heo, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 25 days.

(21) Appl. No.: 17/750,566

(22) Filed: May 23, 2022

(65) Prior Publication Data

US 2023/0051918 A1 Feb. 16, 2023

(30) Foreign Application Priority Data

Aug. 13, 2021 (KR) ........................ 10-2021-0107575

(51) Int. Cl.
*G06F 3/044* (2006.01)
*G06F 3/041* (2006.01)
*H03M 1/66* (2006.01)

(52) U.S. Cl.
CPC ........ *G06F 3/0446* (2019.05); *G06F 3/04166* (2019.05); *H03M 1/662* (2013.01)

(58) Field of Classification Search
CPC .. G06F 3/04166; G06F 3/0445; G06F 3/0446; H03M 1/662
See application file for complete search history.

(56) References Cited

U.S. PATENT DOCUMENTS

| | | | | |
|---|---|---|---|---|
| 9,195,334 B2* | 11/2015 | Hayashi | ................ | G06F 3/0445 |
| 9,256,329 B1* | 2/2016 | Shen | ..................... | G06F 3/0418 |
| 9,280,245 B2* | 3/2016 | Ekici | ..................... | G06F 3/0446 |
| 9,477,356 B2* | 10/2016 | Shen | ..................... | G06F 3/0443 |
| 9,557,873 B2* | 1/2017 | Hayashi | ................ | G06F 3/0416 |
| 9,696,863 B2 | 7/2017 | Reynolds | | |
| 9,746,972 B2 | 8/2017 | Kim | | |
| 9,921,668 B1* | 3/2018 | Chadda | ............... | G06F 3/04182 |
| 10,042,476 B2 | 8/2018 | Wilson et al. | | |
| 10,409,414 B2* | 9/2019 | Kim | ..................... | G06F 3/0443 |
| 11,003,267 B2 | 5/2021 | Kim et al. | | |

(Continued)

FOREIGN PATENT DOCUMENTS

| | | |
|---|---|---|
| KR | 10-2019-0070771 | 6/2019 |
| KR | 10-2088970 | 3/2020 |

(Continued)

*Primary Examiner* — Michael Pervan
(74) *Attorney, Agent, or Firm* — F. Chau & Associates, LLC

(57) ABSTRACT

An input sensing unit includes a touch sensing unit, which includes a plurality of driving electrodes, a plurality of sensing electrodes, and a driving signal generating unit which provides driving signals to the driving electrodes. The sensing electrodes are insulated from and intersect the driving electrodes. The driving signal generating unit includes touch drivers connected to driving electrodes and a digital-to-analog converter configured to provide a first signal or a second signal, and each of the touch drivers is connected to a preset number of driving electrodes among the driving electrodes.

20 Claims, 14 Drawing Sheets

(56) References Cited

U.S. PATENT DOCUMENTS

| | | | | |
|---|---|---|---|---|
| 2014/0240280 | A1* | 8/2014 | Ekici | G06F 3/041662 |
| | | | | 345/174 |
| 2014/0292676 | A1* | 10/2014 | Hayashi | G06F 3/0445 |
| | | | | 345/173 |
| 2014/0292678 | A1* | 10/2014 | Hayashi | G06F 3/0446 |
| | | | | 345/173 |
| 2014/0292679 | A1* | 10/2014 | Kida | G06F 3/0446 |
| | | | | 345/173 |
| 2014/0292680 | A1* | 10/2014 | Nakagawa | G06F 3/04166 |
| | | | | 345/173 |
| 2014/0375598 | A1* | 12/2014 | Shen | G06F 3/0446 |
| | | | | 345/174 |
| 2016/0026300 | A1* | 1/2016 | Hayashi | G06F 3/0445 |
| | | | | 345/174 |
| 2016/0231854 | A1* | 8/2016 | Koo | G06V 40/1306 |
| 2017/0083158 | A1* | 3/2017 | Hayashi | G06F 3/0445 |
| 2022/0365556 | A1* | 11/2022 | Wheeler | G06F 1/1652 |

FOREIGN PATENT DOCUMENTS

| | | |
|---|---|---|
| KR | 10-2020-0082181 | 7/2020 |
| KR | 10-2189480 | 12/2020 |

* cited by examiner

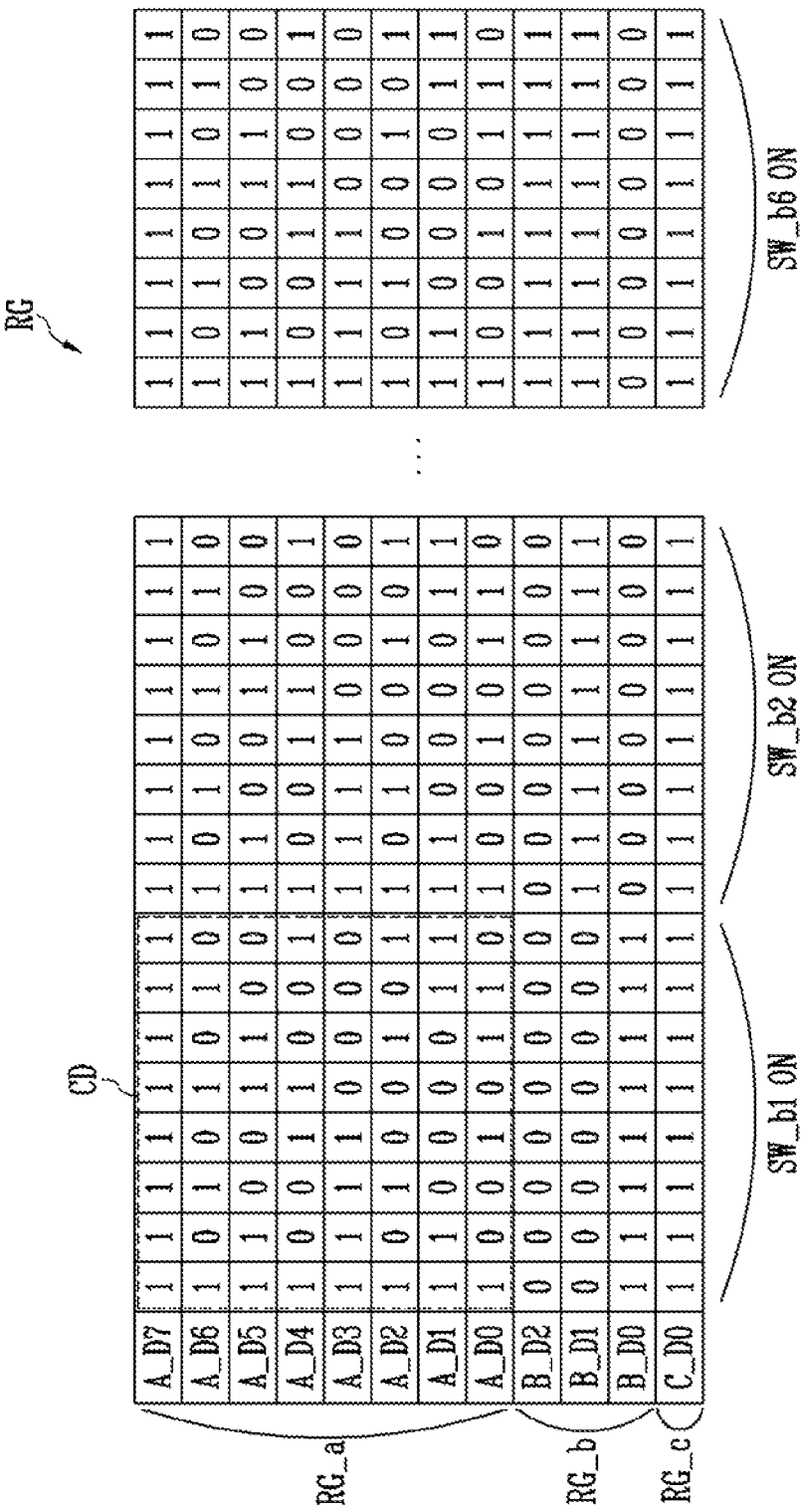

FIG. 4

$$\begin{bmatrix} 1 & 1 & 1 & 1 & 1 & 1 & 1 & 1 \\ 1 & -1 & 1 & -1 & 1 & -1 & 1 & -1 \\ 1 & 1 & -1 & -1 & 1 & 1 & -1 & -1 \\ 1 & -1 & -1 & 1 & 1 & -1 & -1 & 1 \\ 1 & 1 & 1 & 1 & -1 & -1 & -1 & -1 \\ 1 & -1 & 1 & -1 & -1 & 1 & -1 & 1 \\ 1 & 1 & -1 & -1 & -1 & -1 & 1 & 1 \\ 1 & -1 & -1 & 1 & -1 & 1 & 1 & -1 \end{bmatrix} \begin{matrix} n=1,2,3,4,5 \\ TX(1)\sim TX(8n+1) \to 23a \\ TX(2)\sim TX(8n+2) \to 23b \\ TX(3)\sim TX(8n+3) \to 23c \\ TX(4)\sim TX(8n+4) \to 23d \\ TX(5)\sim TX(8n+5) \to 23e \\ TX(6)\sim TX(8n+6) \to 23f \\ TX(7)\sim TX(8n+7) \to 23g \\ TX(8)\sim TX(8n+8) \to 23h \end{matrix}$$

T1 T2 T3 T4 T5 T6 T7 T8
$\underbrace{\qquad\qquad\qquad\qquad}_{T}$

FIG. 6

| EN | B_D2 | B_D1 | B_D0 | 1 | 2 | 3 | 4 | 5 | 6 |
|----|------|------|------|---|---|---|---|---|---|
| 0  | X    | X    | X    | X | X | X | X | X | X |
| 1  | 0    | 0    | 0    | 0 | 0 | 0 | 0 | 0 | 0 |
| 1  | 0    | 0    | 1    | 1 | 0 | 0 | 0 | 0 | 0 |
| 1  | 0    | 1    | 0    | 0 | 1 | 0 | 0 | 0 | 0 |
| 1  | 0    | 1    | 1    | 0 | 0 | 1 | 0 | 0 | 0 |
| 1  | 1    | 0    | 0    | 0 | 0 | 0 | 1 | 0 | 0 |
| 1  | 1    | 0    | 1    | 0 | 0 | 0 | 0 | 1 | 0 |
| 1  | 1    | 1    | 0    | 0 | 0 | 0 | 0 | 0 | 1 |

DCD

FIG. 8

$$\begin{bmatrix} 1 & 1 & 1 & 1 \\ 1 & -1 & 1 & -1 \\ 1 & 1 & -1 & -1 \\ 1 & -1 & -1 & 1 \end{bmatrix} \begin{matrix} \underline{TX(1) \sim TX(8n+1)} \\ \underline{TX(2) \sim TX(8n+2)} \\ \underline{TX(3) \sim TX(8n+3)} \\ \underline{TX(4) \sim TX(8n+4)} \end{matrix} \begin{matrix} 23a \\ 23b \\ 23c \\ 23d \end{matrix} \quad \begin{bmatrix} 1 & 1 & 1 & 1 \\ 1 & -1 & 1 & -1 \\ 1 & 1 & -1 & -1 \\ 1 & -1 & -1 & 1 \end{bmatrix} \begin{matrix} \underline{TX(5) \sim TX(8n+5)} \\ \underline{TX(6) \sim TX(8n+6)} \\ \underline{TX(7) \sim TX(8n+7)} \\ \underline{TX(8) \sim TX(8n+8)} \end{matrix} \begin{matrix} 23e \\ 23f \\ 23g \\ 23h \end{matrix}$$

T1 T2 T3 T4      T5 T6 T7 T8

$T'$      $T'$

23: 23a, 23b, 23c, 23d, 23e, 23f, 23g, 23h
n=1, 2, 3, 4, 5

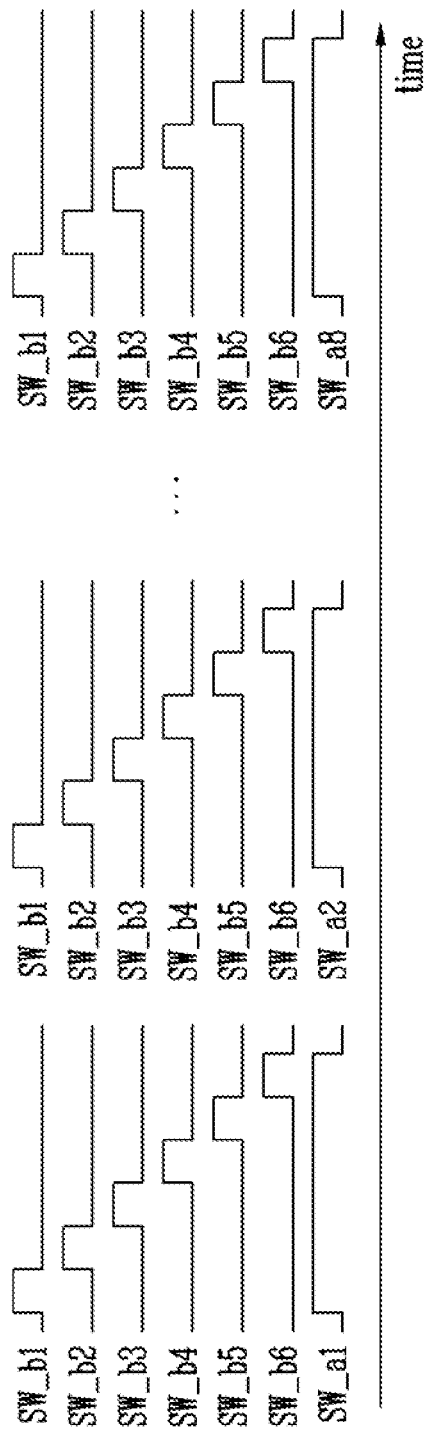

INPUT SENSING UNIT AND METHOD OF DRIVING THE SAME

CROSS-REFERENCE TO RELATED APPLICATION

This application claims priority under 35 U.S.C. § 119 to Korean Patent Application No. 10-2021-0107575, filed in the Korean Intellectual Property Office on Aug. 13, 2021, the disclosure of which is incorporated by reference herein in its entirety.

TECHNICAL FIELD

The present invention relates to an input sensing unit and a method of driving the same.

DISCUSSION OF RELATED ART

Recently display devices have seen increased use consumer electronics. For example, display devices are applied to various electronic appliances such as smart phones, smart watches, digital cameras, notebook computers, navigators, and smart televisions. These display devices may include touch screens to allow users to provide input to the device.

Input sensing units are input devices that allow a user to input commands by selecting instruction contents on a screen of a display device with a person's hand or an object. Input sensing units may be classified into various types, including a resistive film type, a capacitive type, and a photo sensing type. Capacitive type input sensing units ma be further classified into self-capacitance type and a mutual-capacitance type. Capacitive touch screens may allow for multi-touch recognition.

Mutual-capacitance touch technology utilizes a principle wherein, when one or more pointers such as a person's finger touch a surface of a input sensing unit a position of a contact surface can be determined by detecting a change in capacitance formed in a sensing cell (node) positioned on the contact surface. A mutual capacitance input sensing unit contain a grid of nodes, and a mutual capacitance is formed between adjacent nodes. When a user's appendage (finger) or a stylus contacts the surface, there is a change in capacitance near the corresponding nodes due to an electric field of a human body.

A driving signal generating unit may apply a driving signal to driving electrodes of the input sensing unit in this case, the driving signal may have a preset voltage. A value proportional to a mutual capacitance value between the driving electrode and a sensing electrode may be output; when the sensing unit is touched, the value is changed at the location of the touch. The location of a touch may be determined using the output value.

The driving signal may be provided to the driving electrode through touch drivers. The much drivers may be connected one-to-one to the driving electrodes (or touch channels). As larger display devices are manufactured, the area occupied by the touch drivers may increase.

SUMMARY

An embodiment of the present invention provides an input sensing unit in which the number of touch drivers is reduced.

An input sensing unit according to embodiments of the present disclosure includes a touch sensing unit including a plurality of driving electrodes and a plurality of sensing electrodes, wherein each of the plurality of sensing electrodes is insulated from and intersects the driving electrodes. The input sensing unit further includes a driving signal generating unit which provides driving signals to the driving electrodes.

The driving signal generating unit may include touch drivers and a digital-to-analog converter configured to provide a first signal or a second signal, and each of the touch drivers may be connected to a preset number of driving electrodes among the driving electrodes.

The digital-to-analog converter may include a first digital-to-analog converter configured to provide the first signal to a first buffer, and a second digital-to-analog converter configured to provide the second signal to a second buffer.

The first signal and the second signal may be square waves or sine waves, and may have a phase difference of 180° from each other.

The input sensing unit may include an $a^{th}$ normal switch unit disposed between the first buffer and the touch drivers, and an $a^{th}$ inversion switch unit disposed between the second buffer and the touch drivers.

The $a^{th}$ normal switch unit and the $a^{th}$ inversion switch unit may alternately operate.

The $a^{th}$ normal switch unit and the $a^{th}$ inversion switch unit may be turned as and off based on a received driving code to generate the driving signal.

The driving code may have a value corresponding to a 4-bit or 8-bit Hadamard matrix.

In the Hadamard matrix, all elements may 1 or −1, where 1 may correspond to the first signal, and where −1 may correspond to the second signal.

The input sensing unit may further include a plurality of $b^{th}$ switches disposed between each of the touch drivers and the preset number of the driving electrodes, wherein the preset number of driving electrodes are contained within an ordered block of driving electrodes. The $b^{th}$ switches that are disposed in the same ordinal position within each ordered block are concurrently turned on, and the bth switches disposed within one ordered block sequentially turned on.

The input sensing unit may further include a $c1^{st}$ switch disposed between the driving electrodes and a reference power source, and a $c2^{nd}$ switch disposed between the driving electrodes and a ground power source.

The input sensing unit may further include a $b^{th}$ inversion switch unit between the $c1^{st}$ switch and the driving electrodes, wherein the $b^{th}$ switches and the $b^{th}$ inversion switch unit alternately operate.

The driving electrodes may include first to $48^{th}$ driving electrodes, the touch drivers may include first to eighth touch drivers, and the $b^{th}$ switch unit may include $b1^{st}$ to $b6^{th}$ switches.

The first touch driver may be connected to the first to sixth driving electrodes through the $b1^{st}$ to $b6^{th}$ be switches, the second touch driver may be connected to the seventh to twelfth driving electrodes through the $b1^{st}$ to $b6^{th}$ switches, the third touch driver may be connected to the thirteenth to eighteenth driving electrodes through the $b1^{st}$ to $b6^{th}$ switches, the fourth touch driver may be connected to the nineteenth to $24^{th}$ driving electrodes through the $b1^{st}$ to $b6^{th}$ switches, the fifth touch driver may be connected to the $25^{th}$ to $30^{th}$ driving electrodes through the $b1^{st}$ to $b6^{th}$ switches, the sixth touch driver may be connected to the $31^{st}$ to $36^{th}$ driving electrodes through the $b1^{st}$ to $b6^{th}$ switches, the seventh touch driver may be connected to the $37^{th}$ to $42^{nd}$ driving electrodes through the $b1^{st}$ to $b6^{th}$ switches, and the eighth touch driver may be connected to the $43^{rd}$ to $48^{th}$ driving electrodes through the $b1^{st}$ to $b6^{th}$ switches.

The $b1^{st}$ to $b6^{th}$ switches connected to each of the first to eighth touch drivers in any one ordered block may be sequentially turned on, the $b1^{st}$ switches in each ordered block to the first to eighth touch drivers may be concurrently turned on, the $b2^{nd}$ switches in each ordered block may be concurrently turned on, the $b3^{rd}$ switches in each ordered block may be concurrently turned on, the $b4^{th}$ switches in each ordered block may be concurrently turned on, the $b5^{th}$ switches in each ordered block may be concurrently turned on, and the $b6^{th}$ switches in each ordered block may be concurrently turned on.

The input sensing unit may include a sensing unit electrically connected to the sensing electrodes and configured to sense a change in capacitance of a capacitor between the driving electrode to which the driving signal is applied and the sensing electrode corresponding thereto.

A method of driving an input sensing unit is provided. The input sensing unit includes a touch sensing unit which includes a plurality of driving electrodes and a plurality of sensing electrodes which are insulated from and intersect the driving electrodes, and a driving signal generating unit which provides driving signals to the driving electrodes. The method of driving the input sensing unit includes providing, by a digital-to-analog converter, a first signal of a second signal, generating, by an $a^{th}$ switch unit, the driving signal by using the first signal or the second signal, providing, by a $b^{th}$ switch unit, the driving signals to the driving electrodes, and detecting, by a sensing unit, a change in capacitance of a capacitor between the driving electrode to which the driving signal is applied and an electrode corresponding thereto.

The driving signal generating unit may include touch drivers connected to the digital-to-analog converter and the driving electrodes, and each touch driver may be connected to a preset number of driving electrodes among the driving electrodes. The present number of driving electrodes may constitute a block of driving electrodes.

The providing of the driving signals to the driving electrodes may include sequentially providing the driving signals to the driving electrodes in a block, and concurrently providing the driving signals to the driving electrodes having the same ordinal position in each block.

The providing of the driving signals to the driving electrodes may further include providing, by a $b^{th}$ inversion switch unit alternately operating alternately with the $b^{th}$ switch unit, a voltage of a reference power source to the remaining driving electrodes to which the driving signal is not provided among the driving electrodes connected to each of the touch drivers.

The driving signal may be generated based on a driving code, and the driving code may have a value corresponding to a 4-bit or 8-bit Hadamard matrix.

In the Hadamard matrix, all elements may be 1 or −1, 1 may correspond to the first signal, and −1 may correspond to the second signal.

The first signal and the second signal may be square waves or sine waves and may have a phase difference of 180° from each other.

BRIEF DESCRIPTION OF THE DRAWINGS

The above and other aspects and features of the present disclosure will become more apparent by describing in detail embodiments thereof with reference to the attached drawings.

FIG. 3 is a table that shows register information for controlling an $a^{th}$ switch unit, an $a^{th}$ inversion switch unit, a $b^{th}$ switch unit, a $b^{th}$ inversion switch unit, and $c^{th}$ switch unit according to one embodiment.

FIG. 4 shows a Hadamard matrix according to one embodiment.

FIG. 6 is a table that shows decoder codes according to one embodiment.

FIG. 8 shows a Hadamard matrix according to an embodiment.

FIG. 12 is a signal diagram that describes an operation of a touch display panel according to one embodiment.

DETAILED DESCRIPTION

Figure 1:
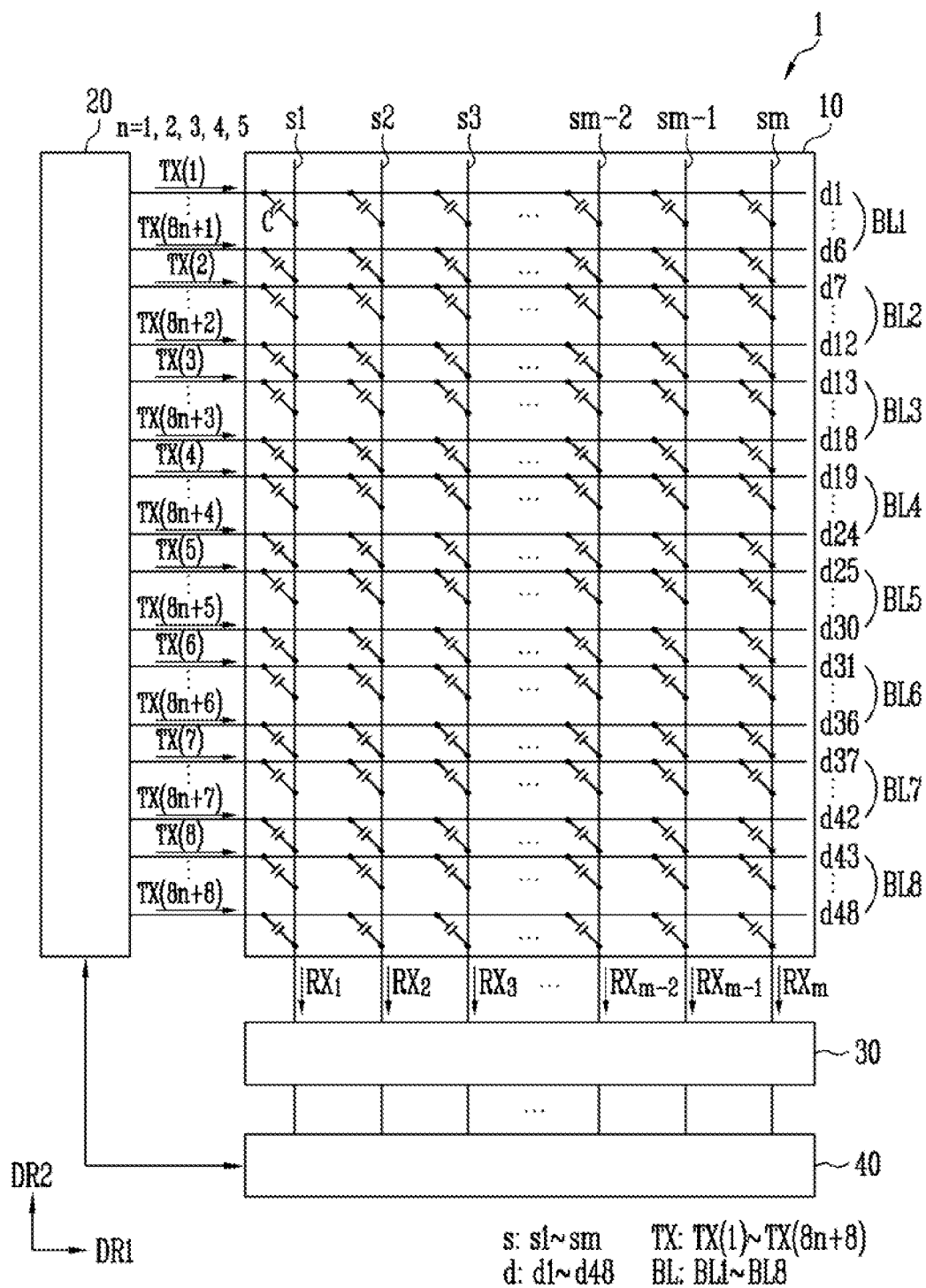
FIG. 1 is a block diagram of an input sensing unit according to one embodiment.

Hereinafter, embodiments of the present inventive concepts will be described in more detail with reference to the accompanying drawings so as to be easily realized, by those skilled in the art to which the present inventive concepts belong. The present inventive concepts may, however, be embodied in different forms and should not be construed as limited to the embodiments set forth herein.

Throughout the specification, like reference symbols in the drawings may denote like elements, and to the extent that a description of an element has been omitted, it may be understood that the element is at least similar to corresponding elements that are described elsewhere in the specification.

As sizes and thicknesses of components in drawings are arbitrarily shown for convenience of description, the sizes and thicknesses are not limited thereto. In the drawing of the present specification, for example, thicknesses may be exaggerated in order to clearly show various layers and regions.

In addition, in the description, the expression "the same" may refer to "substantially the same." That is, the term "the same" may refer to a certain degree of sameness enough to convince a person of ordinary skill in the art. Other expressions may be expressions from which the term "substantially" is omitted. Description of one component in an embodiment may a apply to a plurality of the same components, unless otherwise indicated by the context of the description and the drawings.

FIG. 1 is a block diagram of an input sensing unit according to one embodiment.

Referring to FIG. 1, an input sensing unit 1 may include a touch sensing unit 10, a driving signal generating unit 20, a sensing unit 30, and a control unit 40.

The touch sensing unit 10 may include a plurality of driving electrodes d and a plurality of sensing electrodes s. The plurality of driving electrodes d may extend in a first direction DR1 of the touch sensing unit 10 and may be arranged in parallel (e.g., in rows) along a second direction DR2. The plurality of sensing electrodes s may extend in the second direction DR2 of the touch sensing unit 10 and may be arranged in parallel (e.g., in columns) along the first direction DR1. That is, the touch sensing unit 10 may have an array structure in which the plurality of driving electrodes d are insulated from and intersect the plurality of sensing electrodes s. In this case, the sensing electrodes s may include first to $m^{th}$ sensing electrodes s1 to sm (wherein m is a natural number greater than 1).

Although the driving electrodes d and the sensing electrodes s are illustrated in FIG. 1 as being orthogonal to each other, the present invention is not necessarily limited thereto, and the driving electrodes d and the sensing electrodes s may be arranged to diagonally intersect each other (e.g., the driving electrodes d and the sensing electrodes s may form intersecting angles other than 90°).

Sensing nodes may be defined by capacitors C positioned between the driving electrodes d and the sensing electrodes s which are adjacent to each other. The touch sensing unit 10 may include the plurality of sensing nodes arranged in the first direction DR1 and the second direction DR2. Accordingly, the sensing unit 10 may include a grid of sensing nodes.

Meanwhile, the touch sensing unit 10 may be merged with a display layer (or a display panel) for displaying according to an appropriate panel design method and may share a path for driving and/or sensing.

The driving signal generating unit 20 may be electrically connected to the plurality of driving electrodes d and may provide a driving signal TX to each of the driving electrodes d. According to one embodiment, the touch sensing unit 10 may include the plurality of driving electrodes d, and the plurality of driving electrodes d may be grouped into a preset number of blocks BL. For example, the touch sensing unit 10 may include first to $48^{th}$ driving electrodes d1 to d48, and the first to $48^{th}$ driving electrodes d1 to d48 may be grouped into eight blocks (for example, BL1 to BL8). In this case, one block BL may include six driving electrodes d. However, the number of the driving electrodes d described with reference to FIG. 1 is illustrative, and embodiments may vary in number of driving electrodes d, for example, in proportion to a size of the input sensing unit 1.

According to one embodiment, the driving signal generating unit 20 may sequentially provide driving signals TX to the driving electrodes d included in each of the blocks BL, and may concurrently provide the driving signals TX to the driving electrodes d that are included in the same order in the plurality of blocks BL. For example, the driving signal generating unit 20 may concurrently provide first to eighth driving signals TX(1) to TX(8) to the first driving electrode d1 of a first block BL1, the $7^{th}$ driving electrode d7 of a second block BL2, the $13^{th}$ driving electrode d13 of a third block BL3, the $19^{th}$ driving electrode d19 of a fourth block BL4, the $25^{th}$ driving electrode d25 of a fifth block BL5, the $31^{st}$ driving electrode d31 of a sixth block BL6, the $37^{th}$ driving electrode d37 of a seventh block BL7, and the $43^{rd}$ driving electrode d43 of an eighth block BL8. Immediately after, the driving signal generating unit 20 may concurrently provide ninth to sixteenth driving signals TX(8n+1) to TX(8n+8) (n=1) to the $2^{nd}$ driving electrode of the first block BL1, the $8^{th}$ driving electrode of the second block BL2, the $14^{th}$ driving electrode of the third block BL3, the $20^{th}$ driving electrode of the fourth block BL4, the $26^{th}$ driving electrode of the fifth block BL5, the $32^{nd}$ driving electrode of the sixth block BL6, the $38^{th}$ driving electrode of the seventh black BL7, and the $44^{th}$ driving electrode of the eighth block BL8. Similarly, next, the d g signal generating unit 20 may sequentially provide the other simultaneous sets of driving signals: the seventeenth to $24^{th}$ driving signals TX(8n+1) to TX(8n+8) (n=2), then the $25^{th}$ and $32^{th}$ driving signals TX(8n+1) to TX(8n+8) (n=3), then the $33^{rd}$ to $40^{th}$ driving signals TX(8n+1) to TX(8n+8) (n=4), and then the $41^{st}$ to $48^{th}$ driving signals TX(8n+1) to TX(8n+8) (n=5) to the corresponding electrodes d. A detailed configuration of the driving signal generating unit 20 will be described below with reference to FIGS. 2A and 2B.

According to one embodiment, the driving signal TX may have a voltage in which high-level voltage and a low-level voltage swing. For example, the driving signal TX may be a square wave or a sine wave, or similar periodic waveform.

The sensing unit 30 may be electrically connected to the plurality of sensing electrodes s and may detect a sensing capacitance of the capacitor C between the driving electrode d, to which the driving signal TX is applied, and the sensing electrode s corresponding thereto. When a touch event occurs from the outside, a touch position may be detected through a change in capacitance value of the capacitor C disposed near the touch position.

The control unit 40 may control operations of the driving signal generating unit 20 and the sensing unit 30. For example, the control unit 40 may control the operations of the driving signal generating unit 20 and the sensing unit 30 according to a driving control signal and a sensing control signal.

The control unit 40 controls the driving signal generating unit 20 to drive some driving electrodes (for example, d1, d7, d13, d19, d25, d31, d37, and d43) among the plurality of driving electrodes (for example, d1 to d48) at the same time. In addition, the control unit 40 may control the sensing unit 30 to detect signals received to the sensing electrodes s and output sensing signals RX1 to RXm according to detected results.

Figure 2A:
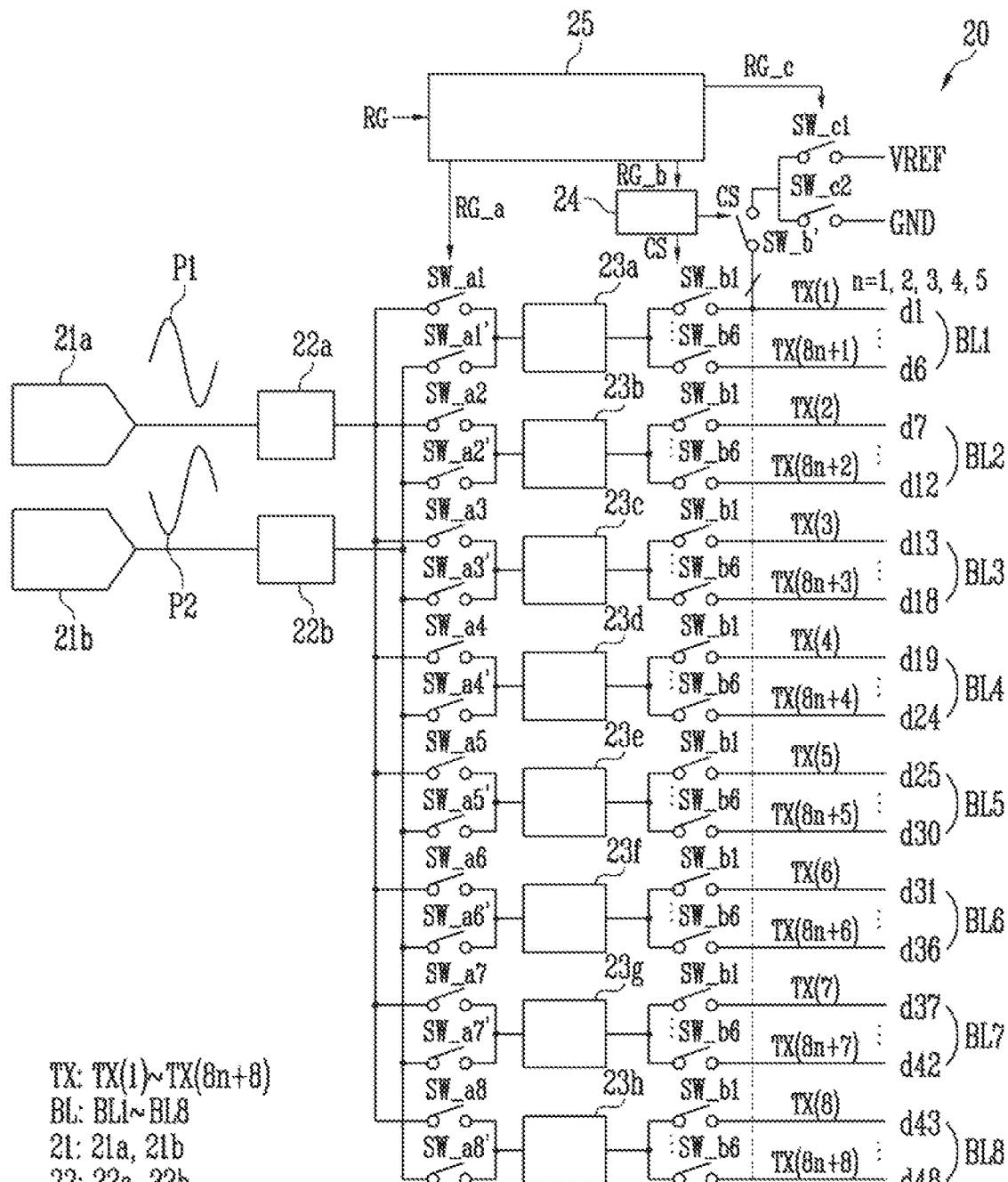
FIG. 2A is a block diagram of a driving signal generating unit according to one embodiment.
Figure 2B:
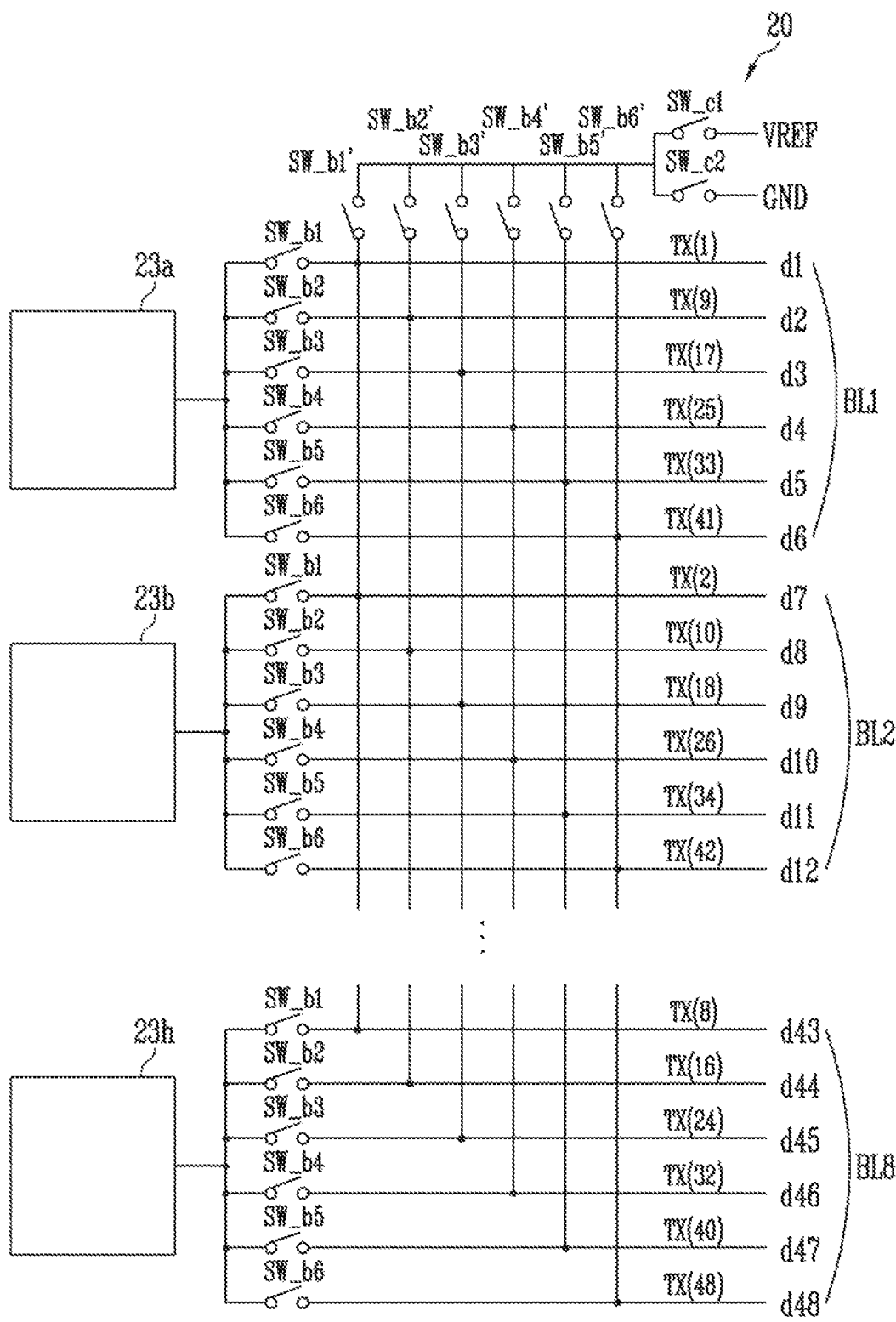
FIG. 2B is a diagram that describes operations of a $b^{th}$ switch unit, a $b^{th}$ inversion switch unit, and a $c^{th}$ switch unit shown in FIG. 2A.

FIG. 2A is a block diagram of a driving signal generating unit according to one embodiment. FIG. 2B is a diagram that describes operations of a $b^{th}$ switch unit, a $b^{th}$ inversion switch unit, and a $c^{th}$ switch unit shown in FIG. 2A.

Referring to FIG. 2A, a driving signal generating unit 20 may include a digital-to-analog converter 21, a buffer 22, an $a^{th}$ switch unit SW_a, an $a^{th}$ inversion switch unit SW_a', a touch driver 23, a $b^{th}$ switch unit SW_b, a $b^{th}$ inversion switch unit SW_b', a $c^{th}$ switch unit SW_c, a decoder 24, and a driving signal controller 25.

The digital-to-analog converter 21 may include a first digital-to-analog converter 21a configured to provide a first signal P1, and a second digital-to-analog converter 21b configured to provide a second signal P2. In this case, the first signal P1 may be a sine wave of a sin(θ) function, and a second signal P2 may be a sine wave of a sin(θ+π) function having a phase difference of 180° from the first signal P1. In an embodiment, the first signal P1 and the second signal P2 may be square waves having a phase difference of 180°. The second signal P2 may be a signal in which the first signal P1 is vertically inverted.

The buffer 22 may include a first buffer 22a with one end connected to the first digital-to-analog converter 21a and the other end connected to the $a^{th}$ switch unit SW_a and a second buffer 22b with one end connected to the second digital-to-analog convener 21b and the other end connected to the $a^{th}$ inversion switch unit SW_a'. The first buffer 22a may provide the first signal P1 to the $a^{th}$ switch unit SW_a, and the second buffer 22b may provide the second signal P2 to the $a^{th}$ inversion switch unit SW_a'.

The $a^{th}$ switch unit SW_a may have one end connected to the first buffer 22a and the other end connected to the touch driver 23, and the $a^{th}$ inversion switch unit SW_a' may have one end connected to the second buffer 22b and the other end connected to the touch driver 23. The $a^{th}$ switch unit SW_a may provide the first signal P1 to the touch driver 23 when it is turned on, and the $a^{th}$ switch unit SW_a' may provide the second signal P2 to the touch driver 23 when it is turned on. The $a^{th}$ switch unit SW_a and the $a^{th}$ inversion switch unit SW_a' may operate alternately. That is, when the $a^{th}$ switch unit SW_a is turned on, the $a^{th}$ inversion switch unit SW_a' may be turned off, and when the $a^{th}$ switch unit SW_a is turned off, the $a^{th}$ inversion switch unit SW_a' may be turned on.

According to one embodiment, the number of pairs of the $a^{th}$ switch unit SW_a and the $a^{th}$ inversion switch unit SW_a' may correspond to the number of blocks BL. For example, when the number of the blocks BL is 8, there may be 8 pairs of the $a^{th}$ switch unit SW_a and the a inversion switch unit SW_a'.

On/off operations of the $a^{th}$ switch unit SW_a and the $a^{th}$ inversion switch unit SW_a' may be controlled based on an $a^{th}$ register RG_a provided from the driving signal controller 25.

The touch driver 23 may be connected on one end to the $a^{th}$ switch unit SW_a and the $a^{th}$ inversion switch unit SW_a' and connected on the other end to the $b^{th}$ switch unit SW_b. The touch driver 23 may provide the first signal P1 or the second signal P2 p to the $b^{th}$ switch unit SW_b. The first signal P1 is received when the $a^{th}$ switch unit SW_a is turned on, and the second signal P2 is received when the $a^{th}$ inversion switch unit SW_a' is turned on. For example, a first touch driver 23a may provide the first signal P1 or the second signal P2 to $b1^{st}$ to $b6^{th}$ switches SW_b1 to SW_b6 for a given block BL as a driving signal TX. In this case, the number of the touch drivers 23 may be the same as the number of the blocks BL.

The $b^{th}$ switch unit SW_b may be connected on one end to the touch driver 23 and connected on the other end to the specific block BL. One block BL may include a preset number of driving electrodes d. For example, when a first block BL1 includes six driving electrodes d1 to d6, six switches SW_b1 to SW_b6 may be disposed between the first touch driver 23a and the six driving electrodes d1 to d6.

The decoder 24 may generate a control signal CS for controlling on/off operations of $b^{th}$ switches SW_b1 to SW_b6 included in each block BL, based on a $b^{th}$ register RG_b provided from the driving signal controller 25. In addition, the control signal CS may be provided to the $b^{th}$ inversion switch unit SW_b'.

On/off operations of $b^{th}$ inversion switches SW_b1' to SW_b6' (described in detail below with reference to FIG. 2B) included in each block BL and an on-off operation of the $b^{th}$ inversion switch unit SW_b' may be controlled based on the control signal CS provided from the decoder 24. The $b^{th}$ switch unit SW_b and the $b^{th}$ inversion switch unit SW_b' may operate alternately. For example, whet the $b^{th}$ switch unit SW_b is turned on, the $b^{th}$ inversion switch unit SW_b' may be turned off and when the $b^{th}$ switch unit SW_b is turned off the $b^{th}$ inversion switch unit SW_b' may be turned on. The $c^{th}$ switch unit SW_c may include a $c1^{st}$ switch SW_c1 with one end connected to a supplied reference power source VREF, and the other end connected to the $b^{th}$ inversion switch unit SW_b'. The $c^{th}$ switch unit SW_c may further include a a $c2^{nd}$ switch SW_c2 with one end connected to a ground power source GND and the other end connected to the $b^{th}$ inversion switch unit SW_b'. The $c1^{st}$ switch SW_c1 and the $c2^{nd}$ switch SW_c2 may operate alternately. For example, when the $c1^{st}$ switch SW_c1 is turned on, the $c2^{nd}$ switch SW_c2 may be turned off, and when the $c1^{st}$ switch SW_c1 is turned off, the $c2^{nd}$ switch SW_c2 may be turned on.

The $c^{th}$ switch unit SW_c may control on/off operations of the $c1^{st}$ switch SW_c1 and the $c2^{nd}$ switch SW_c2 based on a $c^{th}$ register RG_c provided from the driving signal controller 25.

Referring to FIG. 2B, each of first to eighth touch drivers 23a to 23h may be connected to $b1^{st}$ to $b6^{th}$ switches SW_b1 to SW_b6 late in a block BL. The number of the $b^{th}$ inversion switch units SW_b' may be the same as the number of the $b^{th}$ switch units SW_b connected to one touch driver 23.

One end of a $b1^{st}$ inversion switch SW_b1' may be connected to the $b1^{st}$ switches SW_b1, which are connected to each touch driver 23, one end of a $b2^{nd}$ inversion switch SW_b2' may be connected to the $b2^{nd}$ switches SW_b2 which are also connected to each touch driver 23, one end of a $b3^{rd}$ inversion switch SW_b' may be connected to the $b3^{rd}$ switches SW_b3 connected to each touch driver 23, one end of a $b4^{th}$ inversion switch SW_b4' may be connected to the $b4^{th}$ switches SW_b4 connected to each touch driver 23, one end of a $b5^{th}$ inversion switch SW_b5' may be connected to the $b5^{th}$ switches SW_b5 connected to each touch driver 23, and one end of a $b6^{th}$ inversion switch SW_b6' may be connected to the $b6^{th}$ switches SW_b6 connected to each touch driver 23. Meanwhile, the other ends of the $b^{th}$ inversion switches SW_b' may be connected to an end of the $c^{th}$ switch unit SW_c.

As described above with reference to FIG. 2A, the $b^{th}$ switch unit SW_b and the $b^{th}$ inversion switch unit SW_b' may operate alternately based on the control signal CS provided from the decoder 24. Therefore, since, when the $b^{th}$ switch unit SW_b is turned on, the $b^{th}$ inversion switch unit SW_b' is turned off, the first signal P1 or the second signal P2 provided from the touch driver 23 may be provided to the driving electrode d connected to a specific $b^{th}$ switch unit SW_b as the driving signal TX. Conversely, since, when the $b^{th}$ switch unit SW_b is turned off, the $b^{th}$ inversion switch unit SW_b' is turned on, the reference power source VREF or the ground power source GND provided through the $c^{th}$ switch unit SW_c may be applied to the driving electrode d connected to the specific $b^{th}$ switch unit SW_b, determined by which $c^{th}$ switch unit SW_c is turned on.

Since the plurality of $b^{th}$ switches SW_b1 to SW_b6 connected to one touch driver 23 are sequentially driven, when any one $b^{th}$ switch (for example, SW_b1) is turned on, the remaining $b^{th}$ switches (for example, SW_b2 to SW_b26) may be turned off. For example, the first signal P1 or the second signal P2 provided from the touch driver 23 may be applied to a first driving electrode d1 connected to the $b1^{st}$ switch (for example, SW_b1) as a driving signal TX(1), and a voltage of the reference power source VREF or the ground power source GND provided through the $c^{th}$ switch unit SW_c may be applied to the driving electrodes d2 to d6 connected to the remaining $b2^{nd}$ to $b6^{th}$ switches SW_b2 to SW_b6.

Figure 5:
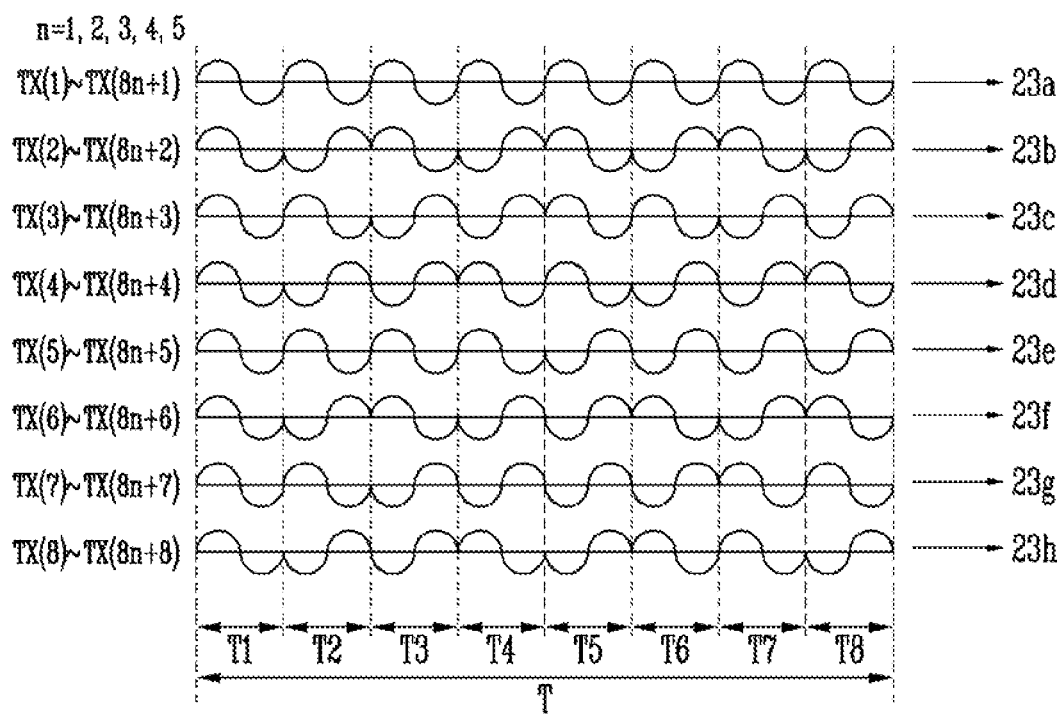
FIG. 5 is a diagram that illustrates driving signals corresponding to the Hadamard matrix of FIG. 4.

FIG. 3 is a table that shows register information for controlling an $a^{th}$ switch unit, an $a^{th}$ inversion switch unit, a $b^{th}$ switch unit, a $b^{th}$ inversion switch unit, and a $c^{th}$ switch unit according to one embodiment FIG. 4 shows a Hadamard matrix according to one embodiment. FIG. 5 is a diagram that illustrates driving signals corresponding to the Hadamard matrix of FIG. 4. FIG. 6 is a table that shows decoder codes according to one embodiment.

Referring to FIGS. 2A and 3, a driving signal controller 25 according to one embodiment may receive register information RG from a control unit 40. The register information RG may include an $a^{th}$ register RG_a for controlling operations of an $a^{th}$ switch unit SW_a and an $a^{th}$ inversion switch unit SW_a', a $b^{th}$ register RG_b for controlling an operation of a $b^{th}$ switch unit SW_b, and a $c^{th}$ register RG_c for controlling an operation of a $c^{th}$ switch unit SW_c. According to one embodiment, the register information RG may be composed of 12 bits. The $a^{th}$ register RG_a may be composed of 8 bits A_D0 to A_D7, the $b^{th}$ register RG_b may be composed of 3 bits B_D0 to B_D2, and the register RG_c may be composed of 1 bit C_D0.

First, in an embodiment, the $a^{th}$ register RG_a may be generated by repeatedly applying driving codes CD having orthogonality. For example, the driving code CD may correspond to the Hadamard matrix shown in FIG. 4.

In the Hadamard matrix, all elements are either 1 or −1, and both of a first column and a first row may be set to 1. Here, "1" may indicate a first signal P1, and "−1" may indicate a second signal P2. The sum of elements positioned in each of the remaining columns excluding the first column may be set to 0, and the sum of elements positioned in each of the remaining rows excluding the first row may be set to 0.

"1" of the driving code CD shown in FIG. 3 may correspond to "1" of the Hadamard matrix, and "0" of the driving code CD may correspond to "−1" of the Hadamard matrix. Accordingly, when "1" of the driving code CD is applied, the $a^{th}$ switch unit SW_a may be turned on to provide the first signal P1 to a touch driver 23, and when "0" of the driving code CD is applied, the $a^{th}$ switch unit SW_a' may be turned on to provide the second signal P2 to the touch driver 23.

Although the Hadamard matrix shown in FIG. 4 has been described as a 8-bit-based matrix in an example embodiment, the present invention is not necessarily limited thereto, and the Hadamard matrix may be based on a matrix composed of various numbers of bits such as 4 bits, 16 bits. 32 bits, and 64 bits according to a size of an input sensing unit 1 and the number of driving electrodes d.

Each row of the Hadamard matrix may correspond to each touch driver 23, and each column of the Hadamard matrix may correspond to each of driving periods T1 to T8.

Each sensing node of the touch sensing unit 10 shown in FIG. 1 corresponds to each element of the Hadamard matrix. The Hadamard matrix, the elements therein, and their corresponding signals, may be repeatedly applied in a column direction. For example, an 8-bit Hadamard matrix may be applied to sensing nodes in first to eighth columns, the same Hadamard matrix may be applied to sensing nodes it ninth to sixteenth columns, and such an arrangement may be repeated until, for example, all columns in the grid of sensing nodes in the touch sensing unit 10 are driven.

Referring to FIGS. 4 and 5, based on the $a^{th}$ resister RG_a applied to the $a^{th}$ switch unit SW_a and the $a^{th}$ inversion switch unit SW_a', and during one period T, driving signals (for example, TX(1) to TX(8)) of FIG. 5 may be applied to touch drivers 23a to 23h, respectively. The signals shown in FIGS. 4 and 5 are provided as examples, and the driving signals TX(1) to TX(8) generated by the Hadamard matrix are not necessarily limited thereto.

Referring to FIGS. 2A, 2B, 3, and 6, a decoder 24 may receive the $b^{th}$ register RG_b from the driving signal controller 25 and may provide a control signal CS to the $b^{th}$ switch unit SW_b using a decoder code DCD. In this case, the decoder 24 does not operate when an enable signal EN has a value of "0" and may operate when the enable signal EN has a value of "1."

For example, when the decoder 24 receives the $b^{th}$ register RG_b having a value of "000," the decoder 24 may provide the control signal CS for turning off all of $b1^{st}$ to $b^{th}$ switches SW_b1 to SW_b6 connected to each of the touch drivers 23. In this case, since the control signal CS is also provided to the $b^{th}$ inversion switch SW_b' (e.g., the $b^{th}$ inversion switch SW_b', comprising $b1^{st}$ to $b6^{th}$ inversion switches SW_b1' to SW_b6$^{th}$), $b1^{st}$ to $b6^{th}$ to be inversion switches SW_b1' to SW_b6' may be turned on.

The following examples describe conditions wherein the decoder 24 receives various $b^{th}$ register RG_b values, for example, the values provided in FIG. 6. When the decoder 24 receives the $b^{th}$ register RG_b having a value of "001," the decoder 24 may provide the control signal CS to turn on the $b1^{st}$ switch SW_b1 connected to each of the touch drivers 23 and turning off the $b2^{nd}$ to $b6^{th}$ switches SW_b2 to SW_b6 connected to each of the touch drivers 23. In this case, since the control signal CS is also provided to the $b^{th}$ inversion switch SW_b', the $b1^{st}$ inversion switch SW_b1' may be turned off, and the $b2^{nd}$ to $b6^{th}$ inversion switches SW_b2' to SW_b6' may be turned on. As shown in FIG. 3, in this case, since the $c^{th}$ register RG_c has a value of "1," a $c1^{st}$ switch SW_c1 may also be turned on.

When the decoder 24 receives the $b^{\prime th}$ register RG_b having a value of "010," the decoder 24 may provide the control signal CS to turn on the $b2^{nd}$ switch SW_b2 connected to each of the touch drivers 23 and turning off the $b1^{st}$ switch SW_b1 and the $b3^{rd}$ to $b6^{th}$ switches SW_b3 to SW_b6 connected to each of the touch drivers 23. In this case, since the control signal CS is also provided to the $b^{th}$ inversion switch SW_b', the $b2^{nd}$ inversion switch SW_b2' may be turned off, and the $b1^{st}$ inversion switch SW_b1' and the $b3^{rd}$ to $b6^{th}$ inversion switches SW_b3' to SW_b6' may, be turned on. As shown in FIG. 3, in this case, since the $c^{th}$ register RG_c has a value of "1," the $c2^{st}$ switch SW_c1 may also be turned on.

When the decoder 24 receives the bth register RG_b having a value of "011," the decoder 24 may provide the control signal CS to turn on the $b3^{rd}$ switch SW_b3 connected to each of the touch drivers 23 and turning off the $b1^{st}$ switch SW_b1, the $b2^{nd}$ switch SW_b2, and the $b4^{th}$ to $b6^{th}$ switches SW_b4 to SW_b6 connected to each of the touch drivers 23. In this case, since the control signal CS is also provided to the $b^{th}$ inversion switch SW_b', the $b3^{rd}$ inversion switch SW_b3' may be turned off, and the $b1^{st}$ inversion switch SW_b1', the $b2^{nd}$ inversion switch SW_b2', and the $b4^{th}$ to $b6^{th}$ inversion switches SW_b4' to SW_b6' may be turned on. As shown in FIG. 3, in this case, since the $c^{th}$ register RG_c has a value of "1," the $c1^{st}$ switch SW_c1 may also be turned on.

When the decoder 24 receives the $b^{th}$ register RG_b having a value of "100," the decoder 24 may provide the control signal CS to turn on the $b4^{th}$ switch SW_b4 connected to each of the touch drivers 23 and turning off the $b1^{st}$ to $b3^{rd}$ switches SW_b1 to SW_b3, the $b5^{th}$ switch SW_b5, and the $b6^{th}$ switch SW_b6 connected to each of the touch drivers 23. In this case, since the control signal CS is also provided to the $b^{th}$ inversion switch SW_b', the $b4^{th}$ inversion switch SW_b4' may be turned off, and the $b1^{st}$ to $b3^{rd}$ inversion switches SW_b1' to SW_B3' the $b5^{th}$ inversion switch SW_b5', and the $b6^{th}$ inversion switch. SW_b6' may be turned on. As shown in FIG. 3, in this case, since the $c^{th}$ register RG_c has a value of "1," the $c^{st}$ switch SW_c1 may also be turned on.

When the decoder 24 receives the $b^{th}$ register RG_b having a value of "101," the decoder 24 may provide the control signal CS to turn on the $b5^{th}$ switch SW_b5 connected to each of the touch drivers 23 and turning off the $b1^{st}$ to $b4^{th}$ switches SW_b1 to SW_b4, and the $b6^{th}$ switch SW_b6 connected to each of the touch drivers 23. In this case, since the control signal CS is also provided to the $b^{th}$ inversion switch SW_b', the $b5^{th}$ inversion switch SW_b5' may be turned off, and the $b1^{st}$ to $b4^{th}$ inversion switches SW_b1' to SW_b4', and the $b6^{th}$ inversion switch SW_b6' may be turned on. As shown in FIG. 3, in this case, since the $c^{th}$ register RG_c has a value of "1," the $c1^{st}$ switch SW_c1 may also be turned on.

When the decoder 24 receives the $b^{th}$ register RG_b having a value of "110," the decoder 24 may provide the control signal CS to turn on the $b6^{th}$ switch SW_b6 connected to each of the touch drivers 23 and turning off the $b1^{st}$ to $b5^{th}$ switches SW_b1 to SW_b5 connected to each of the touch drivers 23. In this case, since the control signal CS is also provided to the $b^{th}$ inversion switch SW_b', the $b6^{th}$ inversion switch SW_b6' may be turned off, and the $b1^{st}$ to $b5^{th}$ inversion switches SW_b1' SW_b5' may be turned on. As shown in FIG. 3, in this case, since the $c^{th}$ register RG_c has a value of "1," the $c1^{st}$ switch SW_c1 may also be turned on.

That is, according to the register information RG shown in FIG. 3, while the $b1^{st}$ switches SW_b1 connected to the touch drivers 23 remain turned on, the driving signals TX(1) to TX(8) of one period T shown in FIG. 5 may be applied to driving electrodes d1, d7, d13, d19, d25, d31, d37, and d43 connected to the $b1^{st}$ switches SW_b1, and a voltage of a reference power source VREF may be applied to the remaining driving electrodes d.

While the $b2^{nd}$ switches SW_b2 connected to the touch drivers 23 remain turned on (for example, after the on period of the $b1^{st}$ switches SW_b1), driving signals TX(9) to TX(16) of one period T shown in FIG. 5 may be applied to driving electrodes d2, d8, d14, d20, d26, d32, d38, and d44 connected to the $b2^{nd}$ switches SW_b2, and a voltage of the reference power source VREF may be applied to the remaining driving electrodes d.

While the $b3^{rd}$ switches SW_b3 connected to the touch drivers 23 remain turned on (for example, after the on period of the $b2^{nd}$ switches SW_b2), driving signals TX(17) to TX(24) of one period T shown in FIG. 5 may be applied to driving electrodes d3, d9, d15, d21, d27, d33, d39, and d45 connected to the $b3^{rd}$ switches SW_b3, and a voltage of the reference power source VREF may be applied to the remaining driving electrodes d.

While the $b4^{th}$ switches SW_b4 connected to the touch drivers 21 remain turned on (for example, after the on period of the $b3^{rd}$ switches SW_b3), driving signals TX(25) to TX(32) of one period T shown in FIG. 5 may be applied to driving electrodes d4, d10, d16, d22, d28, d34, d40, and d46 connected to the $b4^{th}$ switches SW_b4, and a voltage of the reference power source VREF may be applied to the remaining driving electrodes d.

While the $b5^{th}$ switches SW_b5 connected to the touch drivers 23 remain turned on (for example, after the on period of the $b4^{th}$ switches SW_b4), driving signals TX(33) to TX(401 of one period T shown in FIG. 5 may be applied to driving electrodes d5, d11, d17, d23, d29, d35, d41, and d47 connected to the $b5^{th}$ switches SW_b5, and a voltage of the reference power source VREF may be applied to the remaining driving electrodes d.

While the $b6^{th}$ switches SW_b6 connected to the touch drivers 23 remain turned on (for example, after the on period of the $b5^{th}$ switches SW_b5), driving signals TX(41) to TX(48) of one period T shown in FIG. 5 may be applied to driving electrodes d6, d12, d18, d24, d30, d36, d42, and d48 connected to the $b6^{th}$ switches SW_b6, and a voltage of the reference power source VREF may be applied to the remaining driving electrodes d.

A signal applied to the driving electrodes (for example, d1, d7, d19, d25, d31, d37, and d43) in each row is applied to sensing electrodes s1 to sm through sensing nodes of FIG. 1. In an example embodiment, since one sensing electrode s1 intersects the driving electrodes d1, d7, d13, d19, d25, d31, d37, and d43 in all rows, the one sensing electrode s1 may receive a signal with respect to the sum of all signals (for example, TX(1) to TX(8)) applied to the driving electrodes d1, d7, d13, d19, d25, d31, d37, and d43, in each row and transmits the received signal to a sensing unit 30. For example, in a second period T2, a signal with respect to the sum of the first signal P1 applied to a first driving electrode d1, the second signal P2 applied to a seventh driving electrode d7, the first signal P1 applied to a thirteenth driving electrode d13, the second signal P2 applied to a nineteenth driving electrode d19, the first signal P1 applied to a twenty-fifth driving electrode d25, the second signal P2 applied to a thirty-first driving electrode d31, the first signal P1 applied to a thirty-seventh driving electrode d37, and the second signal P2 applied to an forty-third driving electrode d43 is applied to the sensing electrode s1, and the applied signal is transmitted to the sensing unit 30 as a first sensing signal RX1. Accordingly, when a touch event is not present (for example, near a node residing in the column of the sensing electrode s1), the first sensing signal RX1 may be 0.

The sensing unit 30 may be electrically connected to a plurality of sensing electrodes s and may detect a sensing capacitance of a capacitor C between the driving electrode d to which a driving signal TX is applied and the sensing electrode s corresponding thereto. When a touch event occurs, for example, from a user, a touch position may be detected through a change in capacitance value of the capacitor C near the touch position.

As described above, in the input sensing unit 1 according to one embodiment of the present invention, instead of connecting the touch driver 23 for each driving electrode d, the touch drivers 23 are connected in a unit of a block BL including preset driving, electrodes d, thereby reducing the Dumber of the touch drivers 23. Accordingly, an area occupied by a driving signal generating unit 20 in an electronic device according to the present disclosure may be reduced.

Hereinafter, other embodiments will be described. In the following embodiments, differences between previously described embodiments will be mainly described. To the extent that a description of an element has been omitted, it may be understood that the element is at least similar to corresponding elements that have been previously described.

Figure 7:
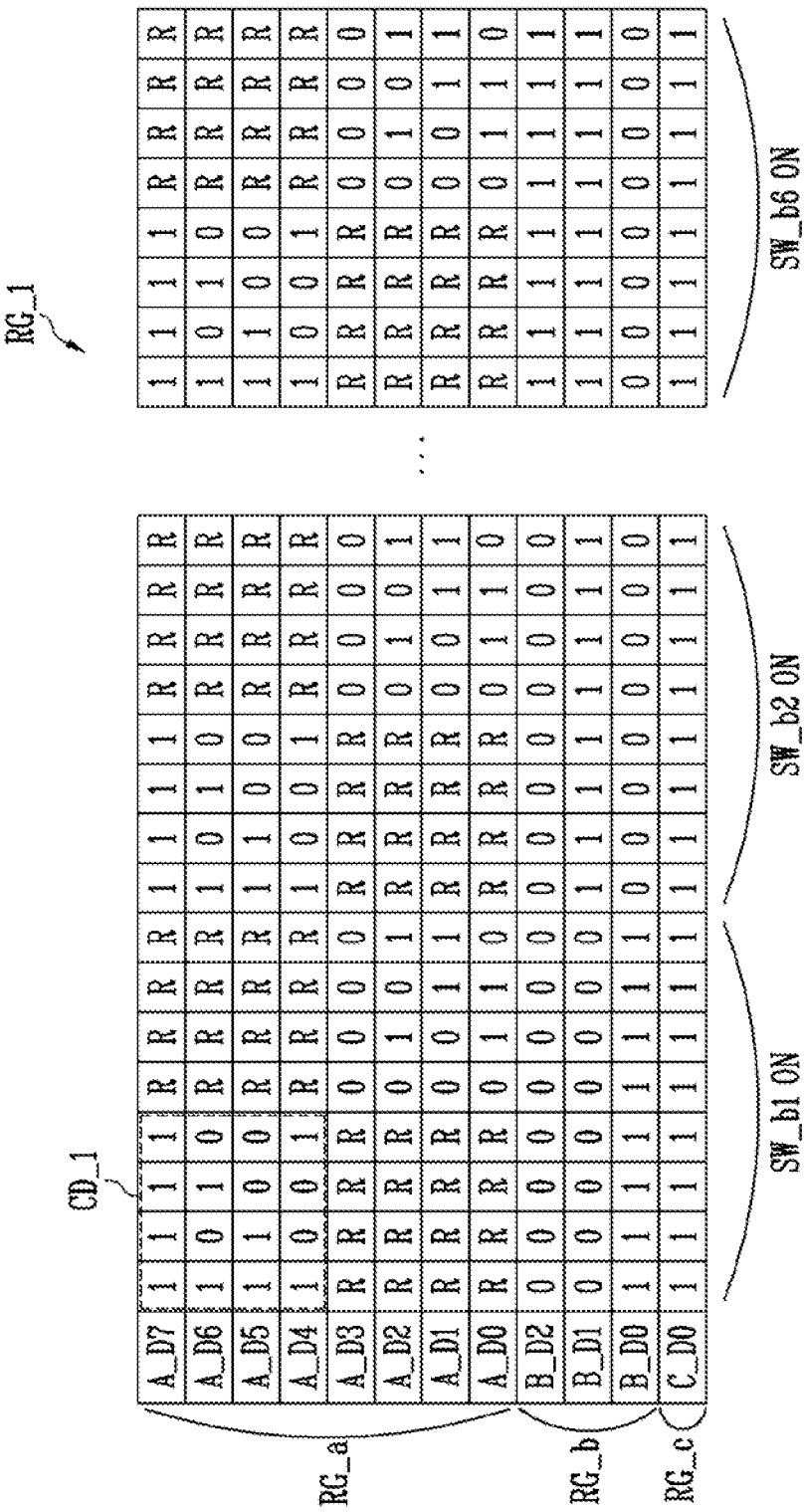
FIG. 7 is a table that shows register information for controlling an $a^{th}$ switch unit, an $a^{th}$ inversion switch unit, a $b^{th}$ switch unit, a $b^{th}$ inversion switch unit, and a $c^{th}$ switch unit according to an embodiment.
Figure 9:
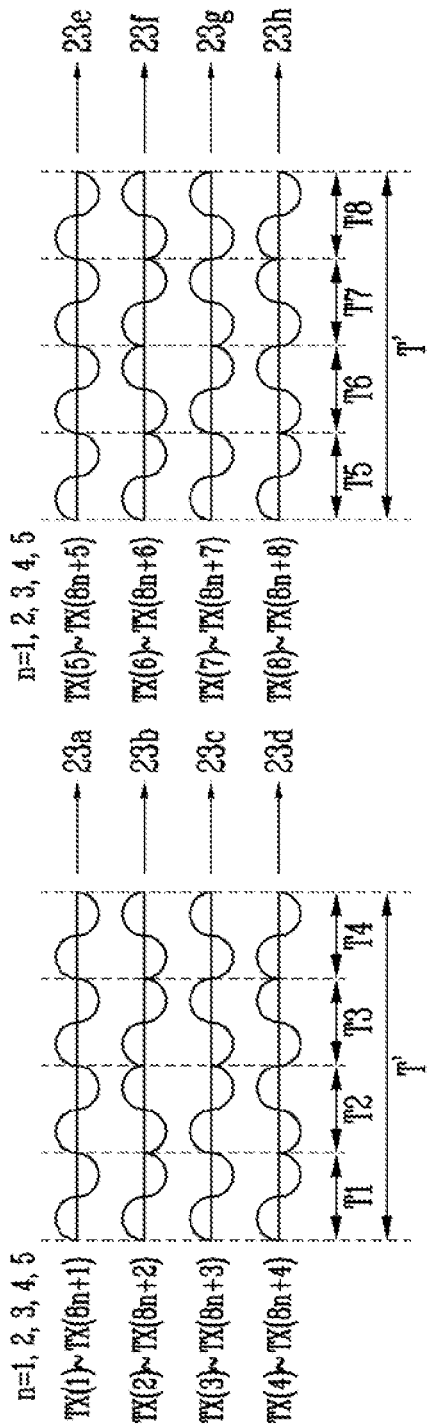
FIG. 9 is a diagram that illustrates driving signals corresponding to the Hadamard matrix of FIG. 8.

FIG. 7 is a table that shows register information for controlling an $a^{th}$ switch unit, an $a^{th}$ inversion switch unit, a $b^{th}$ switch unit, a $b^{th}$ inversion switch unit, and a $c^{th}$ switch unit according to an embodiment. FIG. 8 shows a Hadamard matrix according to an embodiment. FIG. 9 is a diagram that illustrates driving signals corresponding to the Hadamard matrix of FIG. 8.

The embodiment shown in FIGS. 7 to 9 is different from the embodiment shown in FIGS. 3 to 5 using an 8-bit-based driving code CD in that a 4-bit-based driving code CD_1 is used.

Specifically, referring to FIGS. 2A and 7, a driving signal controller 25 according to one embodiment may receive register information RG_1 from a control unit 40. The register information RG_1 may include an $a^{th}$ register RG_a for controlling operations of an $a^{th}$ switch unit SW_a and an $a^{th}$ inversion switch unit SW_a', a $b^{th}$ register RG_b for controlling an operation of to $b^{th}$ switch unit SW_b, and a $c^{th}$ register RG_c for controlling an operation of a $c^{th}$ switch unit SW_c. According to one embodiment, the register information RG_1 may be composed of 12 bits. The $a^{th}$ register RG_a may be composed of 8 bits A_D0 to A_D7, the $b^{th}$ register RG_b may be composed of 3 bits B_D0 to B_D2, and the $c^{th}$ register RG_c may be composed of 1 bit C_D0.

In an embodiment, the $a^{th}$ register RG_a may be generated by repeatedly applying the 4-bit-based driving code CD_1 having orthogonality. For example, the driving code CD_1 may correspond to the Hadamard matrix shown in FIG. 8.

"1" from the driving code CD_1 shown in FIG. 7 may correspond to "1" of the Hadamard matrix, and "0" from the driving code CD_1 may correspond to "−1" of the Hadamard matrix. Accordingly, when "1" from the driving code CD is applied, the $a^{th}$ switch unit SW_a may be turned on to provide a first signal P1 to a touch driver 23, and when "0" from the driving code CD is applied, the $a^{th}$ switch unit SW_a' may be turned on to provide a second signal P2 to the touch driver 23. Meanwhile, "R" shown in the $a^{th}$ register RG_a may denote a blank region, and both the $a^{th}$ switch unit SW_a and the $a^{th}$ inversion switch unit SW_a' may be turned off in response thereto. Accordingly, neither the first signal P1 or the second signal P2 may be provided to the touch driver 23.

Since the Hadamard matrix shown in FIG. 5 is based on 4 bits, unlike the 8-bit-based Hadamard matrix shown in FIG. 4, each row of the Hadamard matrix corresponds to each of touch drivers 23a to 23d or 23e to 23h, and each column of the Hadamard matrix may correspond to each of driving periods T1 to T4 or T5 to T8.

Each sensing node of the touch sensing unit 10 shown in FIG. 1 corresponds to each element of the Hadamard matrix. The Hadamard matrix may be repeatedly applied in a column direction. For example, a 4-bit Hadamard matrix may be applied to sensing nodes in first to fourth columns, the same Hadamard matrix may be applied to the sensing nodes in fifth to eighth columns, and such an arrangement may be repeated.

Referring to FIGS. 5 and 9, based on the $a^{th}$ resister RG_a applied to the $a^{th}$ switch unit SW_a and the $a^{th}$ inversion switch unit SW_a', during one period T1 of T', driving signals (for example, TX(1) to TX(4)) of FIG. 9 may be applied to first to fourth touch drivers 23a to 23d. During a next period T2 of T', driving signals (for example, TX(5) to TX(8)) of FIG. 9 may be applied to fifth to eighth touch drivers 23e to 23h.

Referring to FIGS. 2A, 2B, 6, and 7, a decoder 24 may receive the $b^{th}$ register RG_b from the driving signal controller 25 and may provide a control signal CS to the $b^{th}$ switch unit SW_b using a decoder code DCD. In this case, the decoder 24 does not operate when an enable signal EN has a value of "0" and may operate when the enable signal EN has a value of "1."

According to the register information RG_1 shown in FIG. 7, while b1$^{st}$ switches SW_b1 connected to first to fourth touch drivers 23a to 23d remain turned on, the driving signals TX(1) to TX(4) of one period T1 of T' shown in FIG. 9 may be applied to driving electrodes d1, d7, d13, and d19 connected to the b1$^{st}$ switches SW_b1, and a voltage of a reference power source VREF may be applied to the remaining driving electrodes d. In addition, while the b1$^{st}$ switches SW_b1 connected to fifth to eighth touch drivers 23e to 23h remain turned on, the driving signals TX(5) to TX(8) of the next period T2 of T' shown in FIG. 9 may be applied to driving electrodes d25, d31, d37, and d43 connected to the b1$^{st}$ switches SW_b1, and a voltage of the reference power source VREF may be applied to the remaining driving electrodes d.

While b2$^{nd}$ switches SW_b2 connected to the first to fourth touch drivers 23a to 23d remain turned on (for example, after the on period of the b1$^{st}$ switches SW_b1), driving signals TX(9) to TX(12) of one period 1T' shown in FIG. 9 may be applied to driving electrodes d2, d8, d14, and d20 connected to the b2$^{nd}$ switches SW_b2, and a voltage of the reference power source VREF may be applied to the remaining driving electrodes d. In addition, while the b2$^{nd}$ switches SW_b2 connected to fifth to eighth touch drivers 23e to 23h remain turned on, the driving signals TX(13) to TX(16) of the next period 2T' shown in FIG. 9 may be applied to driving electrodes d26, d32, d38, and d44 connected to the b2$^{nd}$ switches SW_b2, and a voltage of the reference power source VREF may be applied to the remaining driving electrodes d.

While b3$^{rd}$ switches SW_b3 connected to the first to fourth touch drivers 23a to 23d remain turned on (for example, after the on period of the b2$^{nd}$ switches SW_b2), driving signals TX(17) to TX(20) of one period 1T' shown in FIG. 9 may be applied to driving electrodes d3, d9, d15, and d21 connected to the b3$^{rd}$ switches SW_b3, and a voltage of the reference power source VREF may be applied to the remaining driving electrodes d. In addition, while the b3$^{rd}$ switches SW_b3 connected to the fifth to eighth touch drivers 23e to 23h remain turned on, driving signals TX(21) to TX(24) of the next period 2T' shown in FIG. 9 may be applied to driving electrodes d27, d33, d39, and d45 connected to the b3$^{rd}$ switches SW_b3, and a voltage of the reference power source VREF may be applied to the remaining driving electrodes d.

While b4$^{th}$ switches SW_b4 connected to the first to fourth touch drivers 23a to 23d remain turned on (for example, after the on period of the b3$^{rd}$ switches SW_b3), driving signals TX(25) to TX(28) of one period 1T' shown in FIG. 9 may be applied to driving electrodes d4, d16, and d22 connected to the b4$^{th}$ switches SW_b4, and a voltage of the reference power source VREF may be applied to the remaining driving electrodes d. In addition, while the b4$^{th}$ switches SW_b4 connected to the fifth to eighth touch drivers 23e to 23h remain turned on the driving signals TX(29) to TX(32) of the next period 2T' shown in FIG. 9 may be applied to driving electrodes d28, d34, d40, and d46 connected to the b4$^{th}$ switches SW_b4, and a voltage of the reference power source VREF may be applied to the remaining driving electrodes d.

While b5$^{th}$ switches SW_b5 connected to the first to fourth touch drivers 23a to 23d remain turned on (for example, after the on period of b4$^{th}$ switches SW_b4), driving signals TX(33) to TX(36) of one period 1T' shown in FIG. 9 may be applied to driving electrodes d5, d11, d17, and d23 connected to the b5$^{th}$ switches SW_b5, and a voltage of the reference power source VREF may be applied to the remaining driving electrodes d. In addition while the b5$^{th}$ switches SW_b5 connected to the fifth to eighth touch drivers 23e to 23h remain turned on, the driving signals TX(37) to TX(40) of the next period 2T' shown in FIG. 9 may be applied to driving electrodes d29, d35, d41, and d47 connected to the b5$^{th}$ switches SW_b5, and a voltage of the reference power source VREF may be applied to the remaining driving electrodes d.

While b6$^{th}$ switches SW_b6 connected to the first to fourth touch drivers 23a to 23d remain turned on (for example, after the on period b5$^{th}$ switches SW_b5), driving signals TX(41) to TX(44) of one period T1 of T' shown in FIG. 9 may be applied to driving electrodes d6, d12, d18, and d24 connected to the b6$^{th}$ switches SW_b6, and a voltage of the reference power source VREF may be applied to the remaining driving electrodes d. In addition, while the b6$^{th}$ switches SW_b6 connected to the fifth to eighth touch drivers 23e to 23h remain turned on, driving signals TX(45) to TX(48) of the next period T2 of T' shown in FIG. 9 may be applied to driving electrodes d30, d36, d42, and d48 connected to the b6$^{th}$ switches SW_b6, and a voltage of the reference power source VREF may be applied to the remaining driving electrodes d.

A signal applied to the driving electrodes (for example, d1, d5, d9, and so on) in each row is applied to sensing electrodes s1 to sm through sensing nodes of FIG. 1. In this case, since one sensing electrode s1 intersects the driving electrodes d1, d5, d9, . . . in all rows, the one sensing electrode s1 may receive a signal with respect to the sum of all signals (for example, TX(1) to TX(4)) applied to the driving electrodes d1, d5, d9, and d13 in each row and transmits the received signal to a sensing unit 30. For example, in a second period T2 of FIG. 8, a signal with respect to the sum of the first signal P1 applied to a first driving electrode d1, the second signal P2 applied to a fifth driving electrode d5, the first signal P1 applied to a ninth driving electrode d9, and the second signal P2 applied to a thirteenth driving electrode d13 is applied to the sensing electrode s1, and the applied signal is transmitted to the sensing unit 30 as a first sensing signal RX1. Accordingly, when a touch event is not present (for example, when there isn't a touch near the column corresponding to the first sensing electrode s1), the first sensing signal RX1 may be 0.

Meanwhile, the sensing unit 30 may be electrically connected to a plurality of sensing electrodes s and may detect a sensing capacitance of a capacitor C between the driving electrode d to which a driving signal TX is applied and the sensing electrode s corresponding thereto. When a touch event occurs from the outside, a touch position may be detected through a change in capacitance value of the capacitor C near the touch position.

As described above, the embodiment shown in FIGS. 7 to 9 is mainly different from the embodiment shown in FIGS. 3 to 5 in that the number of simultaneously applied driving signals TX is reduced, and it is possible to expect substantially the same effect as the embodiment shown in FIGS. 3 to 5. For example, an electronic device according to the embodiment shown in FIGS. 7 to 9 may have a touch driver that occupies a reduced space and/or area.

Figure 10:
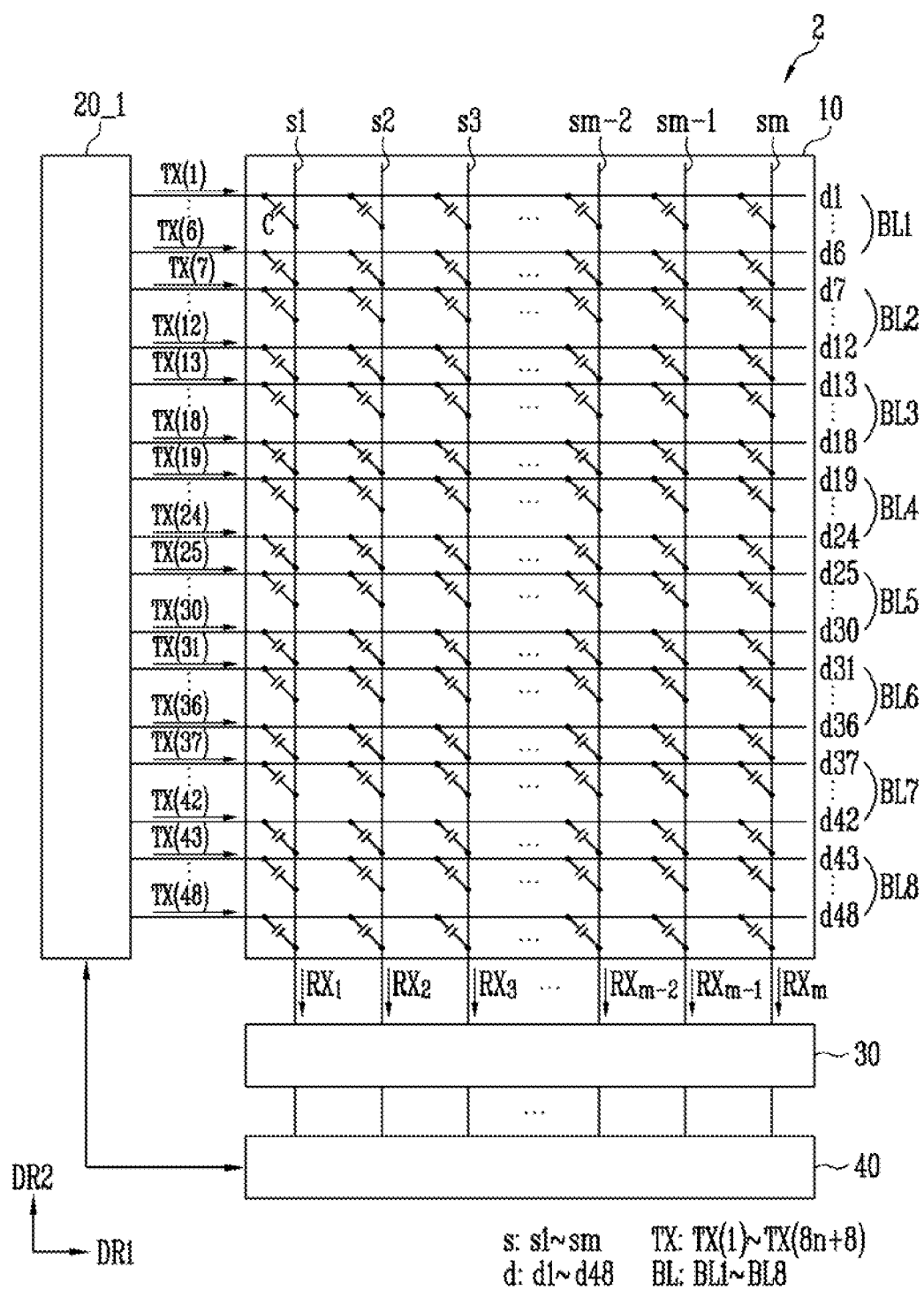
FIG. 10 is a block diagram of an input sensing unit according to an embodiment.
Figure 11A:
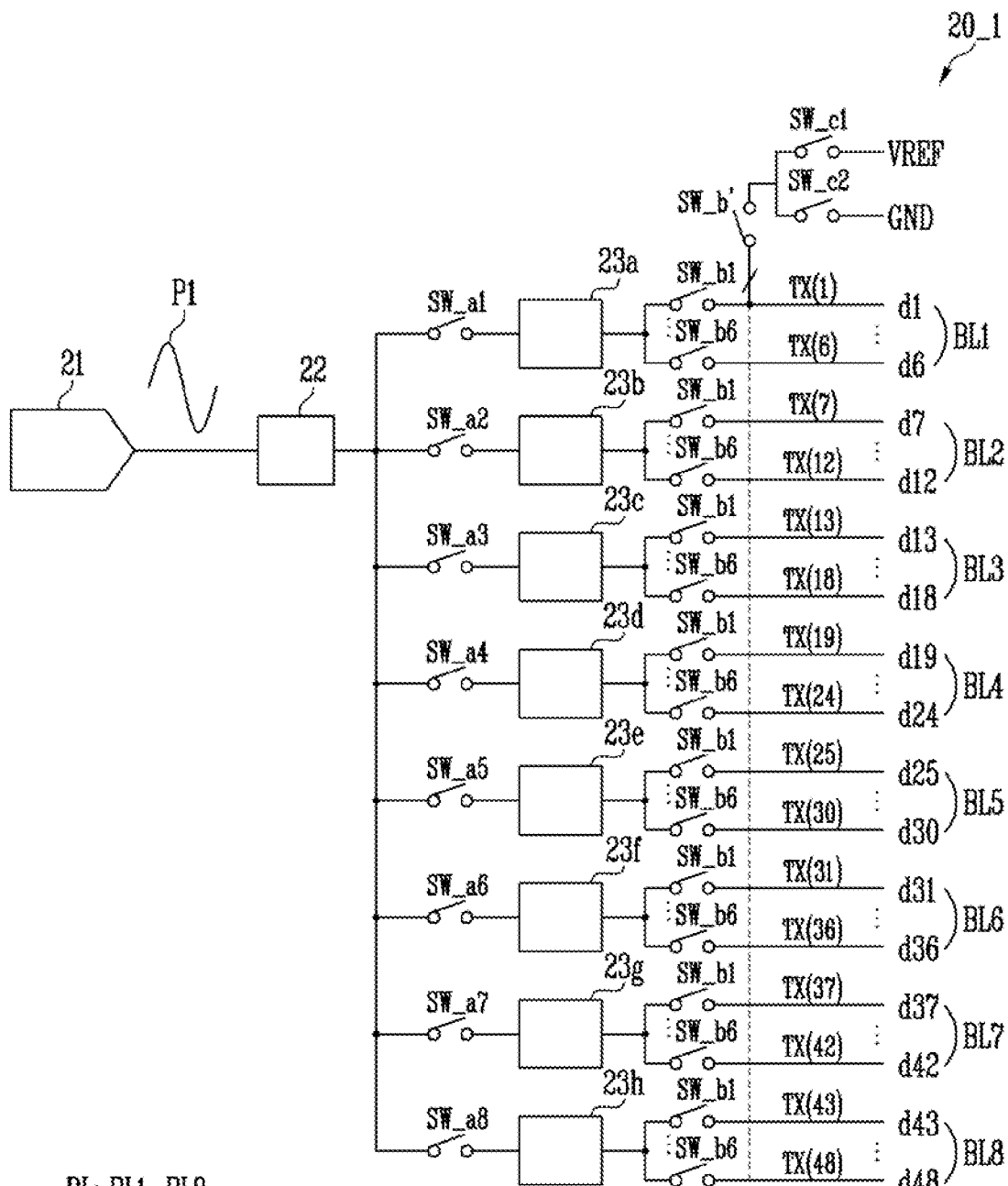
FIG. 11A is a block diagram of a driving signal generating unit according to an embodiment.
Figure 11B:
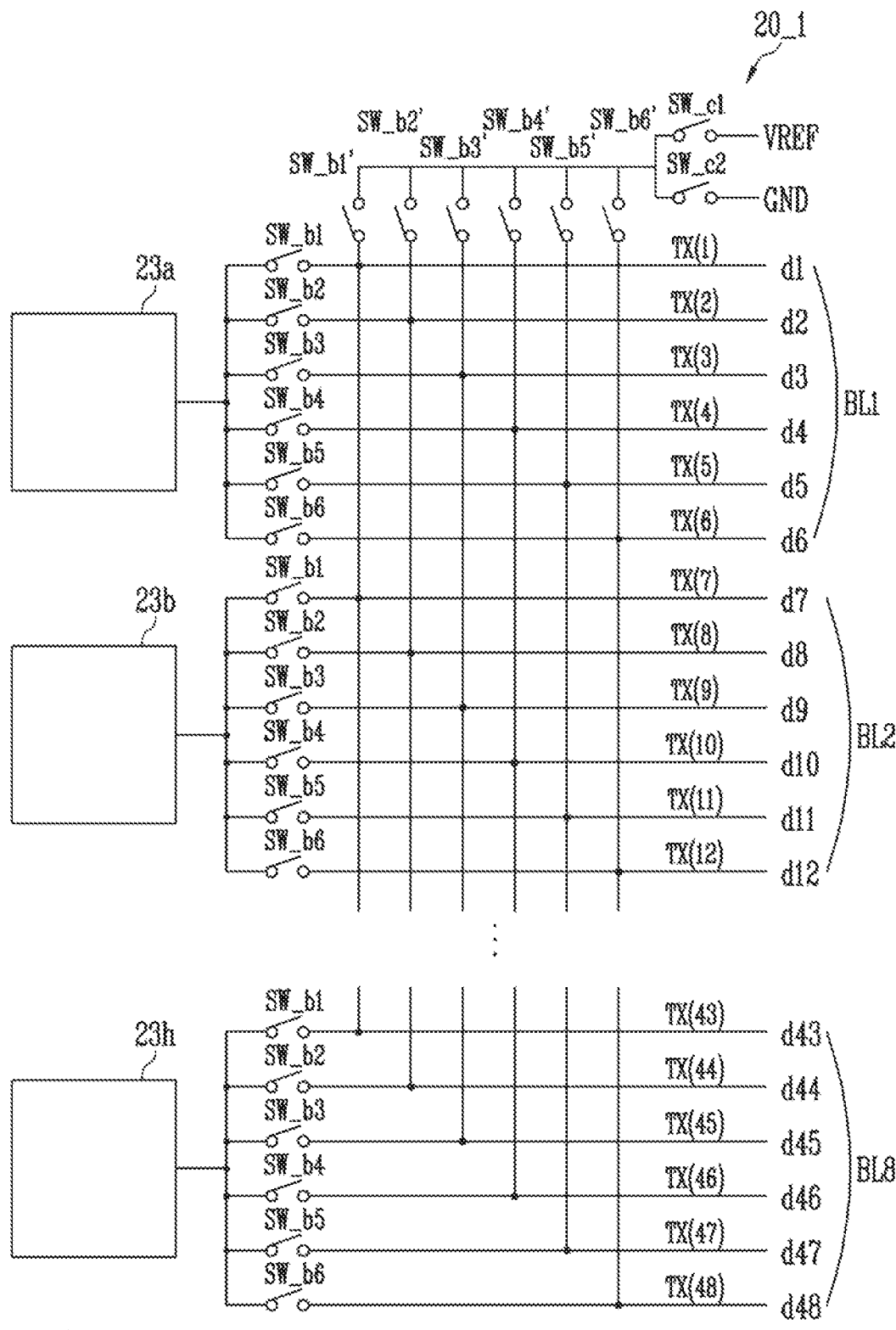
FIG. 11B is a diagram that describes operations of a $b^{th}$ switch unit, a $b^{th}$ inversion switch unit, and a $c^{th}$ switch unit shown in FIG. 11A.

FIG. 10 is a block diagram of an input sensing unit according to an embodiment. FIG. 11A is a block diagram of a driving signal generating unit according to an embodiment. FIG. 11B is a diagram that describes operations of a b$^{th}$ switch unit, a b$^{th}$ inversion switch unit, and a c$^{th}$ switch unit shown in FIG. 11A. FIG. 12 is a signal diagram that describes an operation of a touch display panel according to one embodiment.

As driving signals TX are sequentially applied to driving electrodes d in the embodiments shown in previously described Figures, the embodiment shown in FIGS. 10 to 12 is different from the embodiment shown in FIGS. 3 to 5 in which the driving signals TX are simultaneously applied to grouped driving electrodes d.

Referring to FIG. 10, an input sensing unit 2 may include a touch sensing unit 10, a driving signal generating unit 20_1, a sensing unit 30, and a control unit 40. Since components other than the driving signal generating unit 20_1 are substantially the same as the components shown in FIG. 1, overlapping description will be omitted, and differences will be mainly described.

The driving signal generating unit 20_1 may be electrically connected to the plurality of driving electrodes d and may provide the driving signal TX to each of the driving electrodes d. According to one embodiment, the touch sensing unit 10 may include the plurality of driving electrodes d, and the plurality of driving electrodes d may be grouped into a preset number of blocks BL. For example, the touch sensing unit 10 may include first to 48$^{th}$ driving electrodes d1 to d48, and the first to 48$^{th}$ driving electrodes d1 to d48 may be grouped into eight blocks (for example, BL1 to BL8). In this embodiment, one block BL may include six driving electrodes d. However, the number of the driving electrodes d is illustrative and may vary, for example, may vary in proportion to a size of the input sensing unit 2.

According to one embodiment, the driving signal generating unit 20_1 may provide the driving signals TX in the order from a first block BL1 to an eighth block BL8 and may sequentially provide the driving electrodes d included in each of the blocks BL. Unlike the embodiments previously described, wherein the driving signal generating unit 20 provided simultaneous driving signals TX to one row in every block, the driving signal generating unit 20_ described in this embodiment may simultaneously drive all the rows in only one block. For example, the driving signal generating unit 20_1 may sequentially provide first to sixth driving signals TX(1) to TX(6) to first to sixth driving electrodes d1 to d6 of a first block BL1. Next, the driving signal generating unit 20_1 may sequentially provide seventh to twelfth driving signals TX(7) to TX(12) to seventh to twelfth driving electrodes d7 to d12 of a second, block BL2. Then, the driving signal generating unit 20_1 may sequentially provide thirteenth to eighteenth driving signals TX(13) to TX(18) to thirteenth to eighteenth driving electrodes d13 to d18 of a third block BL3. Next, the driving signal generating unit 20_1 may sequentially provide nineteenth to 24$^{th}$ driving signals TX(19) to TX(24) to nineteenth to 24$^{th}$ driving electrodes d19 to d24 of a fourth block BL4. Thereafter, the driving signal generating unit 20_1 may sequentially provide 25$^{th}$ to 30$^{th}$ driving signals TX(25) to TX(30) to 25$^{th}$ to 30$^{th}$ driving electrodes d25 to d30 of a fifth block BL5. Then, the driving signal generating unit 20_1 may sequentially provide 31$^{st}$ to 36$^{th}$ driving signals TX(31) to TX(36) to 31$^{st}$ to 36$^{th}$ driving electrodes d31 to d36 of a sixth block BL6. Thereafter, the driving signal generating unit 20_1 may sequentially provide 37$^{th}$ to 42$^{nd}$ driving signals TX(37) to TX(42) to 37$^{th}$ to 42$^{nd}$ driving electrodes d37 to d42 of a seventh block BL7. Then, the driving signal generating unit 20_1 may sequentially provide 43$^{rd}$ to 48$^{th}$ driving signals TX(43) to TX(48) to 43$^{rd}$ to 48$^{th}$ driving electrodes d43 to d48 of an eighth block BL8.

According to one embodiment, the driving signal TX may have a voltage in which a high-level voltage and a low-level voltage swing. For example, the driving signal TX may be a square wave or a sine wave, or similar periodic waveform.

Referring to FIG. 11A, the driving signal generating unit 20_1 may include a digital-to-analog converter 21, a buffer 22, an $a^{th}$ switch unit SW_a, a touch driver 23, a $b^{th}$ switch unit SW_b, a $b^{th}$ inversion switch unit SW_b', and a $c^{th}$ switch unit SW_c.

The digital-to-analog converter 21 may provide a first signal P1 to the buffer 22. In this case, the first signal P1 may be a sine wave of a sin(θ) function. However, a type of the first signal P1 is not necessarily limited thereto, and for example, the first signal P1 may be a square wave.

The buffer 22 may have one end connected to the digital-to-analog converter 21 and the other end connected to the $a^{th}$ switch unit SW_a. The buffer 22 may provide the first signal P1 to the $a^{th}$ switch unit (for example, SW_a1 to SW_a8).

The $a^{th}$ switch unit SW_a may have one end connected to the buffer 22 and the other end connected to the touch driver 23. The $a^{th}$ switch unit (for example, SW_a1 to SW_a8) may provide the first signal P1 to the touch driver 23 while it is turned on. According to one embodiment, as shown in FIG. 12, based on a driving control signal received from the control unit 40 of FIG. 10, a$1^{st}$ to a$8^{th}$ switches SW_a1 to SW_a8 may be sequentially turned on.

According to one embodiment, the number of the $a^{th}$ switch units SW_a may be the same as the number of the blocks BL. For example, when the number of the blocks BL is 8, the number of the $a^{th}$ switch units SW_a may also be 8.

The touch driver 23 may have one end connected to the $a^{th}$ switch unit SW_a and the other end connected to the $b^{th}$ switch unit SW_b. The touch driver 23 may provide the first signal P1, which is received when the $a^{th}$ switch unit (for example, SW_a1 to SW_a8) is turned on, to the $b^{th}$ switch unit SW_b. For example, a first touch driver 23a may provide the first signal P1 to b$1^{st}$ to b$6^{th}$ switches SW_b1 to SW_b6 as a driving signal TX. In this case, the number of the touch drivers 23 may be the same as the number of the blocks BL.

The $b^{th}$ switch unit SW_b may have one end connected to the touch driver 23 and the other end connected to the specific block BL. One block BL may include a preset number of the driving electrodes d. For example, when a first block BL1 includes six driving electrodes d1 to d6, six switches SW_b1 to SW_b6 may be disposed between the first touch driver 23a and the six driving electrodes d1 to d6. For example, six switches SW_b1 to SW_b6 may be respectively connected to six driving electrodes d1 to d6.

The $b^{th}$ inversion switch unit SW_b' and the $b^{th}$ switch unit SW_b may operate alternately. That is, when the $b^{th}$ switch unit SW_b is turned on, the $b^{th}$ inversion switch unit SW_b' may be turned off, and when the $b^{th}$ switch unit SW_b is turned off, the $b^{th}$ inversion switch unit SW_b' may be turned on.

The $c^{th}$ switch unit SW_c may include a c$1^{st}$ switch SW_c1 which has one end connected to a reference power source VREF and the other end connected to the $b^{th}$ inversion switch unit SW_b' and a c$2^{nd}$ switch SW_c2 which has one end connected to a ground power source GND and the other end connected to the $b^{th}$ inversion switch unit SW_b'. The c$1^{st}$ switch SW_c1 and the c$2^{nd}$ switch SW_c2 may operate alternately. That is, when the c$1^{st}$ switch SW_c1 is turned on, the c$2^{nd}$ switch SW_c2 may be turned off, and when the c$1^{st}$ switch SW_c1 is turned off, the c$2^{nd}$ switch SW_c2 may be turned on.

Referring to FIG. 11B, each of first to eighth touch drivers 23a to 23h may be connected to the b$1^{st}$ to b$6^{th}$ switches SW_b1 to SW_b6. The number of the $b^{th}$ inversion switch units SW_b' may be the same as the number of the $b^{th}$ switch units SW_b connected to one touch driver 23.

On end of a b$1^{st}$ inversion switch SW_b1' may be connected to the b$1^{st}$ switches SW_b1 connected to each touch driver 23, one end of a b$2^{nd}$ inversion switch SW_b2' may be connected to the b$2^{nd}$ switches SW_b2 connected to each touch driver one end of a b$3^{rd}$ inversion switch SW_b' may be connected to the b$3^{rd}$ switches SW_b3 connected to each touch driver 23, one end of a b$4^{th}$ inversion switch SW_b4' be connected to the b$4^{th}$ switches SW_b4 connected to each touch driver 23, one end of a b$5^{th}$ inversion switch SW_b5' may be connected to the b$5^{th}$ switches SW_b5 connected to each touch driver 23, and one end of a b$6^{th}$ inversion switch SW_b6' may be connected to the b$6^{th}$ switches SW_b6 connected to each touch driver 23. Meanwhile, the $b^{th}$ inversion switches SW_b' may be connected to the other end of the $c^{th}$ switch SW_c.

As described above with reference to FIG. 11A, the $b^{th}$ switch unit SW_b and the $b^{th}$ inversion switch unit SW_b' may operate alternately. Therefore, since, wheat the $b^{th}$ switch unit SW_b is turned on, the $b^{th}$ inversion switch unit SW_b' is turned off, the first signal P1 provided from the touch driver 23 may be provided to the driving electrode d connected to a specific $b^{th}$ switch unit SW_b as the driving signal TX. Conversely, since, when the $b^{th}$ switch unit SW_b is turned off, the $b^{th}$ inversion unit SW_b' is turned on, a voltage of the reference power source VREF or the ground power source GND provided through the $c^{th}$ switch unit SW_c may be applied to the driving electrode d connected to the specific $b^{th}$ switch unit SW_b.

Since the plurality of $b^{th}$ switches SW_b1 to SW_b6 connected to one touch driver 23 are sequentially driven, when any one $b^{th}$ switch (for example, SW_b1) is turned on, the remaining $b^{th}$ switches (for example, SW_b2 to SW_b26) may be turned off. For example, the first signal P1 provided from the touch driver 23 may be applied to a first driving electrode d1 connected to the b$1^{st}$ switch (for example, SW_b1) as a driving signal TX(1), and a voltage of the reference power source VREF or the ground power source GND provided through the $c^{th}$ switch unit SW_c may be applied to the driving electrodes d2 to d6 connected to the remaining b$2^{nd}$ to b$6^{th}$ switches SW_b2 to SW_b6.

According to one embodiment, as shown in FIG. 12, based on a driving control signal received from the control unit 40 of FIG. 10, while an a$1^{st}$ switch SW_a1 remains turned on, the b$1^{st}$ to b$6^{th}$ switches SW_b1 to SW_b6 connected to the first touch driver 23a may be sequentially turned on.

Next, while an a$2^{nd}$ switch SW_a2 remains turned on, the b$1^{st}$ to b$6^{th}$ switches SW_b1 to SW_b6 connected to a second touch driver 23b may be sequentially turned on. Thereafter, while an a$3^{rd}$ switch SW_a3 remains turned on, the b$1^{st}$ to b$6^{th}$ switches SW_b1 to SW_b6 connected to a third touch driver 23c may be sequentially turned on. Next, while an a$4^{th}$ switch SW_a4 remains turned on, the b$1^{st}$ to b$6^{th}$ switches SW_b1 to SW_b6 connected to a fourth touch driver 23d may be sequentially turned on. Subsequently, while an a$5^{th}$ switch SW_a5 remains turned on, the b$1^{st}$ to b$6^{th}$ switches SW_b1 to SW_b6 connected to a fifth touch driver 23e may be sequentially turned on. Next, while an a$6^{th}$ switch SW_a6 remains turned on, the b$1^{st}$ to b$6^{th}$ switches SW_b1 to SW_b6 connected to a sixth touch driver 23f may be sequentially turned on. Thereafter, while an a$7^{th}$ switch SW_a7 remains turned on, the b$1^{st}$ to b$6^{th}$ switches SW_b1 to SW_b6 connected to a seventh touch driver 23g may be sequentially turned on. Next, while an a$8^{th}$ switch SW_a8 remains turned on, the b$1^{st}$ to b$6^{th}$ switches SW_b1 to SW_b6 connected to an eighth touch driver 23h may be sequentially turned on.

As described above, according to the embodiment shown in FIGS. 10 to 12, it is possible to provide substantially the same effect as the embodiment shown in FIGS. 3 to 5 (e.g., a reduced touch driver area) through a simpler structure.

Although the present invention has been described with reference to the embodiments, those skilled in the art will appreciate that various modifications and variations can be made in the present inventive concepts without departing from the spirit or scope of the invention described in the appended claims.

What is claimed is:

1. An input sensing unit comprising:
   a touch sensing unit including a plurality of driving electrodes and a plurality of sensing electrodes, wherein each of the plurality of sensing electrodes is insulated from and intersects the plurality of driving electrodes; and
   a driving signal generating unit which provides driving signals to the plurality of driving electrodes,
   wherein the driving signal generating unit includes touch drivers and a digital-to-analog converter configured to provide a first signal or a second signal, and
   wherein each of the touch drivers is connected to a preset number of driving electrodes among the plurality of driving electrodes and a plurality of switches.

2. The input sensing unit of claim 1, wherein the digital-to-analog converter includes:
   a first digital-to-analog converter configured to provide the first signal to a first buffer; and
   a second digital-to-analog converter configured to provide the second signal to a second buffer.

3. The input sensing unit of claim 2, wherein the first signal and the second signal are square waves or sine waves, and wherein the first signal and has a phase difference of 180° from e second signal.

4. The input sensing unit of claim 2, wherein the plurality of switches comprises:
   an $a^{th}$ normal switch unit disposed between the first buffer and the touch drivers; and
   an $a^{th}$ inversion switch unit disposed between the second buffer and the touch drivers.

5. The input sensing unit of claim 4, wherein the $a^{th}$ normal switch unit and the $a^{th}$ inversion switch unit operate alternately.

6. The input sensing unit of claim 4, wherein the $a^{th}$ normal switch unit and the $a^{th}$ inversion switch unit are turned on and off based on a received driving code to generate the driving signal.

7. The input sensing unit of claim 6, wherein the driving code has a value corresponding to a 4-bit or 8-bit Hadamard matrix.

8. The input sensing unit of claim 7, wherein, in the Hadamard matrix, all elements are 1 or −1, wherein I corresponds to the first signal, and −1 corresponds to the second signal.

9. The input sensing unit of claim 6, further comprising a plurality of $b^{th}$ switches disposed between and connected to each of the touch drivers and the preset number of the driving electrodes, wherein the preset number of driving electrodes are contained within an ordered block of driving electrodes,
   wherein the $b^{th}$ switches that are disposed in the same ordinal position within each ordered block are concurrently turned on, and wherein the $b^{th}$ switches disposed within one ordered block are sequentially turned on.

10. The input sensing unit of claim 9, wherein the plurality of switches comprises:
    a $c1^{st}$ switch disposed between the plurality of driving electrodes and a reference power source; and
    a $c2^{nd}$ switch disposed between the plurality of driving electrodes and a ground power source.

11. The input sensing unit of claim 10, wherein the plurality of switches comprises a $b^{th}$ inversion switch unit disposed between the $c1^{st}$ switch and the plurality of driving electrodes,
    wherein the $b^{th}$ switches and the $b^{th}$ inversion switch unit operate alternately.

12. The input sensing unit of claim 11, wherein the plurality of driving electrodes include $1^{st}$ to $48^{th}$ driving electrodes,
    wherein the touch drivers include first to eighth touch drivers, and
    wherein the $b^{th}$ switch unit includes $b1^{st}$ to $b6^{th}$ switches.

13. The input sensing unit of claim 12, wherein the first touch driver is connected to the first to sixth driving electrodes through the $b1^{st}$ to $b6^{th}$ switches,
    wherein the second touch driver is connected to the seventh to twelfth driving electrodes through the $b1^{st}$ to $b6^{th}$ switches,
    wherein the third touch driver is connected to the thirteenth to eighteenth driving electrodes through the $b1^{st}$ to $b6^{th}$ switches,
    wherein the fourth touch driver is connected to the nineteenth to $24^{th}$ driving electrodes through the $b1^{st}$ to $b6^{th}$ switches,
    wherein the fifth touch driver is connected to the $25^{th}$ to $30^{th}$ riving electrodes through the $b1^{st}$ to $b6^{th}$ switches,
    wherein the sixth touch driver is connected to the $31^{st}$ to $36^{th}$ riving electrodes through the $b1^{st}$ to $b6^{th}$ switches,
    wherein the seventh touch driver is connected to the $37^{th}$ to $42^{nd}$ riving electrodes through the $b1^{st}$ to $b6^{th}$ switches, and
    wherein the eighth touch driver is connected to the $43^{rd}$ to $48^{th}$ riving electrodes through the $b1^{st}$ to $b6^{th}$ switches.

14. The input sensing unit of claim 13, wherein the $b1^{st}$ to $b6^{th}$ switches connected to each of the first to eighth touch drivers are sequentially turned on,
    wherein the $b1^{st}$ switches in each ordered block are concurrently turned on,
    wherein the $b2^{nd}$ switches in each ordered block are concurrently turned on,
    wherein the $b3^{rd}$ switches in each ordered block are concurrently turned on,
    wherein the $b4^{th}$ switches in each ordered block are concurrently turned on,
    wherein the $b5^{th}$ switches in each ordered block are concurrently turned on, and
    wherein the $b6^{th}$ switches in each ordered block are concurrently turned on.

15. The input sensing unit of claim 1, comprising a sensing unit electrically connected to the sensing electrodes and configured to sense a change in capacitance of a capacitor between the driving electrode to which the driving signal is applied and the sensing electrode corresponding thereto.

16. A method of driving an input sensing unit, the input sensing unit including a touch sensing unit which includes a plurality of driving electrodes and a plurality of sensing electrodes insulated from and intersecting the plurality of driving electrodes, and a driving signal generating unit which provides driving signals to the plurality of driving electrodes, the method comprising:
    providing, by a digital-to-analog converter, a first signal or a second signal;

generating, by an $a^{th}$ switch unit, the driving signals by using the first signal or the second signal;

providing, by a $b^{th}$ switch unit, the driving signals to the plurality of driving electrodes; and detecting, by a sensing unit, a change in capacitance of a capacitor between the driving electrode to which the driving signal is applied and an electrode corresponding thereto, wherein the driving signal generating unit includes touch drivers connected to the digital-to-analog converter and the plurality of driving electrodes, and wherein each touch driver is connected to a preset number of driving electrodes constituting a block of driving electrodes among the plurality of driving electrodes, and wherein the providing of the driving signals to the plurality of driving electrodes includes sequentially providing the driving signals to the driving electrodes in a block, and concurrently providing the driving signals to the driving electrodes having a same ordinal position in each block.

17. The method of claim 16, wherein the providing of the driving signals to the plurality of driving electrodes further includes providing, by a $b^{th}$ inversion switch unit operating alternately with the $b^{th}$ switch unit, a voltage of a reference power source to remaining driving electrodes to which the driving signal is not provided among the plurality of driving electrodes connected to each of the touch drivers.

18. The method of claim 16, wherein the driving signal is generated based on a driving code, and wherein the driving code has a value corresponding to a 4-bit or 8-bit Hadamard matrix.

19. The method of claim 18, wherein, in the Hadamard matrix, all elements are 1 or −1, wherein 1 corresponds to the first signal, and wherein −1 corresponds to the second signal.

20. The method of claim 16, wherein the first signal and the second signal are square waves or sine waves, and wherein the first signal has a phase difference of 180° from the second signal.

\* \* \* \* \*